(12) United States Patent
Park et al.

(10) Patent No.: US 11,195,785 B2
(45) Date of Patent: Dec. 7, 2021

(54) INTERPOSER WITH THROUGH ELECTRODE HAVING A WIRING PROTECTION LAYER

(71) Applicant: Samsung Electronics Co., Ltd., Suwon-si (KR)

(72) Inventors: Yukyung Park, Hwaseong-si (KR); Seungkwan Ryu, Seongnam-si (KR); Yunseok Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/891,443

(22) Filed: Jun. 3, 2020

(65) Prior Publication Data

US 2021/0167001 A1 Jun. 3, 2021

(30) Foreign Application Priority Data

Dec. 2, 2019 (KR) ........................ 10-2019-0158456

(51) Int. Cl.
*H01L 23/12* (2006.01)
*H01L 23/14* (2006.01)
*H01L 23/48* (2006.01)
*H01L 21/00* (2006.01)
(Continued)

(52) U.S. Cl.
CPC ...... *H01L 23/49816* (2013.01); *H01L 21/486* (2013.01); *H01L 21/4857* (2013.01);
(Continued)

(58) Field of Classification Search
CPC ............. H01L 23/5383; H01L 21/4857; H01L 23/53295; H01L 21/76843; H01L 23/5386; H01L 23/3171; H01L 24/06; H01L 21/76877; H01L 23/481; H01L 23/5384; H01L 21/486; H01L 23/49816;
(Continued)

(56) References Cited

U.S. PATENT DOCUMENTS 8,922,009 B2 12/2014 Kim et al.
8,952,533 B2 2/2015 Mohammed et al.
(Continued)

FOREIGN PATENT DOCUMENTS

JP 2013-021085 A 1/2013
KR 10-1332865 B1 11/2013
KR 10-1683975 B1 12/2016

*Primary Examiner* — Alonzo Chambliss
(74) *Attorney, Agent, or Firm* — Muir Patent Law, PLLC

(57) ABSTRACT

An interposer includes a base layer having a first surface and a second surface, a redistribution structure on the first surface, an interposer protection layer on the second surface, a pad wiring layer on the interposer protection layer, an interposer through electrode passing through the base layer and the interposer protection layer and electrically connecting the redistribution structure to the pad wiring layer, an interposer connection terminal attached to the pad wiring layer, and a wiring protection layer including a first portion covering a portion of the interposer protection layer adjacent to the pad wiring layer, a second portion covering a portion of a top surface of the pad wiring layer, and a third portion covering a side surface of the pad wiring layer. The third portion is disposed between the first portion and the second portion. The first to third portions have thicknesses different from each other.

20 Claims, 14 Drawing Sheets

(51) Int. Cl.
*H01L 21/44* (2006.01)
*H01L 23/498* (2006.01)
*H01L 23/31* (2006.01)
*H01L 23/538* (2006.01)
*H01L 23/00* (2006.01)
*H01L 21/768* (2006.01)
*H01L 21/48* (2006.01)
*H01L 23/532* (2006.01)

(52) U.S. Cl.
CPC .. *H01L 21/76843* (2013.01); *H01L 21/76877* (2013.01); *H01L 23/3121* (2013.01); *H01L 23/3171* (2013.01); *H01L 23/481* (2013.01); *H01L 23/5381* (2013.01); *H01L 23/5383* (2013.01); *H01L 23/5384* (2013.01); *H01L 23/5386* (2013.01); *H01L 23/53295* (2013.01); *H01L 24/06* (2013.01); *H01L 24/14* (2013.01); *H01L 24/17* (2013.01); *H01L 24/81* (2013.01)

(58) Field of Classification Search
CPC . H01L 23/3121; H01L 23/5381; H01L 24/81; H01L 24/17; H01L 24/14
See application file for complete search history.

(56) References Cited

U.S. PATENT DOCUMENTS

| | | | | |
|---|---|---|---|---|
| 8,956,966 | B2* | 2/2015 | Lin | H01L 23/49827 438/614 |
| 8,993,431 | B2* | 3/2015 | Hsu | H01L 24/05 438/613 |
| 9,508,666 | B2* | 11/2016 | Yu | H01L 23/147 |
| 9,570,366 | B2 | 2/2017 | Jeng et al. | |
| 10,049,975 | B2* | 8/2018 | Liang | H01L 23/562 |
| 10,068,873 | B2 | 9/2018 | Chen | |
| 10,269,739 | B2 | 4/2019 | Chang et al. | |
| 2014/0264838 | A1* | 9/2014 | Chang | H01L 23/49816 257/737 |
| 2014/0342547 | A1* | 11/2014 | Lin | H01L 24/11 438/614 |
| 2014/0346669 | A1* | 11/2014 | Wang | H01L 23/3185 257/737 |
| 2015/0137360 | A1* | 5/2015 | Lin | H01L 24/11 257/737 |
| 2015/0171039 | A1 | 6/2015 | Cheng et al. | |
| 2018/0254227 | A1* | 9/2018 | Chen | H01L 23/49827 |
| 2019/0148171 | A1 | 5/2019 | Chen et al. | |

* cited by examiner

INTERPOSER WITH THROUGH ELECTRODE HAVING A WIRING PROTECTION LAYER

CROSS-REFERENCE TO RELATED APPLICATION

This application claims the benefit of Korean Patent Application No. 10-2019-0158456, filed on Dec. 2, 2019, in the Korean Intellectual Property Office, the disclosure of which is incorporated herein in its entirety by reference.

BACKGROUND

The inventive concept relates to an interposer and a semiconductor package having the same, and more particularly, to an interposer having a redistribution layer and a semiconductor package having the interposer.

With the demand for compact and multifunctional high-performance electronic products, semiconductor packages are desirable to be light and highly integrated and to have high performance and speed. Therefore, there is an increasing demand for semiconductor packages for systems having a high memory bandwidth. Because a memory bandwidth is proportional to a data transfer rate and the number of data transmission lines, the memory bandwidth may be increased by increasing a memory operation speed or the number of data transmission lines. Accordingly, semiconductor packages using an interposer are being introduced to increase the number and density of connection bumps attached to connection pads of semiconductor chips.

SUMMARY

The inventive concept provides an interposer for increasing a memory bandwidth and a semiconductor package having the interposer.

According to an exemplary embodiment of the present inventive concept, an interposer includes a base layer having a first surface and a second surface opposite the first surface, a redistribution structure on the first surface of the base layer, an interposer protection layer on the second surface of the base layer, a pad wiring layer on the interposer protection layer, an interposer through electrode passing through the base layer and the interposer protection layer and electrically connecting the redistribution structure to the pad wiring layer, an interposer connection terminal attached to the pad wiring layer, and a wiring protection layer including a first portion covering a portion of the interposer protection layer adjacent to the pad wiring layer, a second portion covering a portion of a top surface of the pad wiring layer, and a third portion covering a side surface of the pad wiring layer. The third portion is disposed between the first portion and the second portion. The first portion, the second portion and the third portion have thicknesses, in a perpendicular direction with respect to the first surface, different from each other.

According to an exemplary embodiment of the present inventive concept, a semiconductor package includes an interposer including a base layer having a first surface and a second surface opposite the first surface, a redistribution structure on the first surface of the base layer, an interposer protection layer on the second surface of the base layer, a plurality of pad wiring layers on the interposer protection layer, a plurality of interposer through electrodes passing through the base layer and the interposer protection layer, and electrically connecting the redistribution structure to the plurality of pad wiring layers, a plurality of interposer connection terminals attached to the plurality of pad wiring layers, and a plurality of wiring protection layers on the interposer protection layer, the plurality of interposer through electrodes being grouped into a plurality of interposer through electrode groups, each of the plurality of wiring protection layers including a first portion covering a respective portion of the interposer protection layer adjacent to a respective pad wiring layer, a second portion covering a portion of a top surface of a respective pad wiring layer, a third portion covering a side surface of the respective pad wiring layer, and a fourth portion covering a lower portion of a respective interposer connection terminal, the third portion being disposed between the first portion and the second portion, and the second portion being disposed between the third portion and the fourth portion, a first semiconductor chip and a second semiconductor chip that are horizontally separated from each other on the redistribution structure and electrically connected to a first group among the plurality of interposer through electrode groups and a second group among the plurality of interposer through electrode groups, respectively, through the redistribution structure, and a package base substrate having the interposer mounted thereon and connected to the plurality of interposer connection terminals.

According to an exemplary embodiment of the present inventive concept, an interposer includes a base layer having a first surface and a second surface opposite the first surface, an interposer through electrode passing through the base layer and including a protruding portion vertically extending away from the second surface of the base layer, an interposer protection layer on the second surface of the base layer, the interposer protection layer having a top surface coplanar with a top surface of the protruding portion and surrounding a side surface of the protruding portion, a pad wiring layer on the interposer protection layer and connected to the protruding portion, the interposer protection layer being disposed between the base layer and the pad wiring layer, an interposer connection terminal attached to the pad wiring layer, and a wiring protection layer including a first portion covering a portion of the interposer protection layer adjacent to the pad wiring layer, a second portion covering a portion of a top surface of the pad wiring layer, and a third portion covering a side surface of the pad wiring layer. The third portion is disposed between the first portion and the second portion. The first portion, the second portion and the third portion have thicknesses, in a perpendicular direction with respect to the first surface, different from each other.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1A:
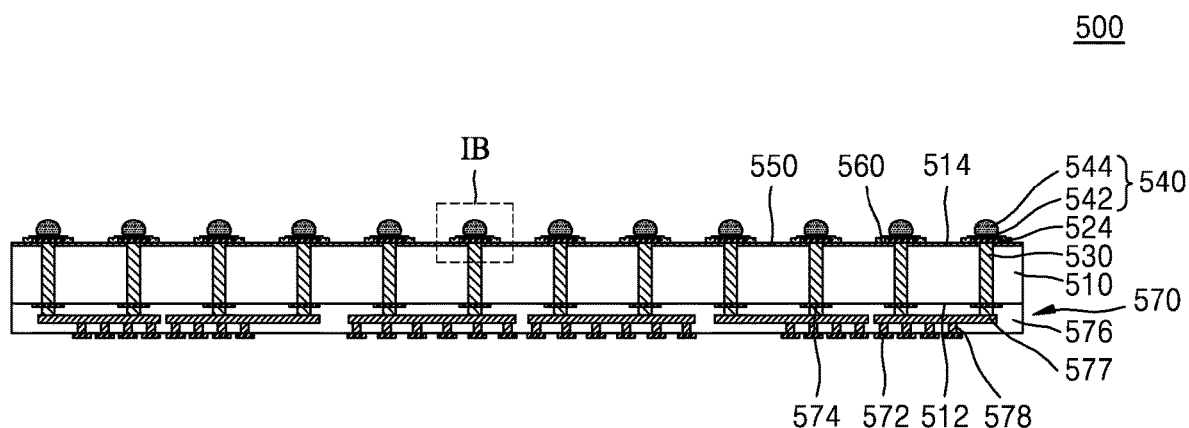
FIG. 1A is a cross-sectional view of an interposer according to embodiments.
Figure 1B:
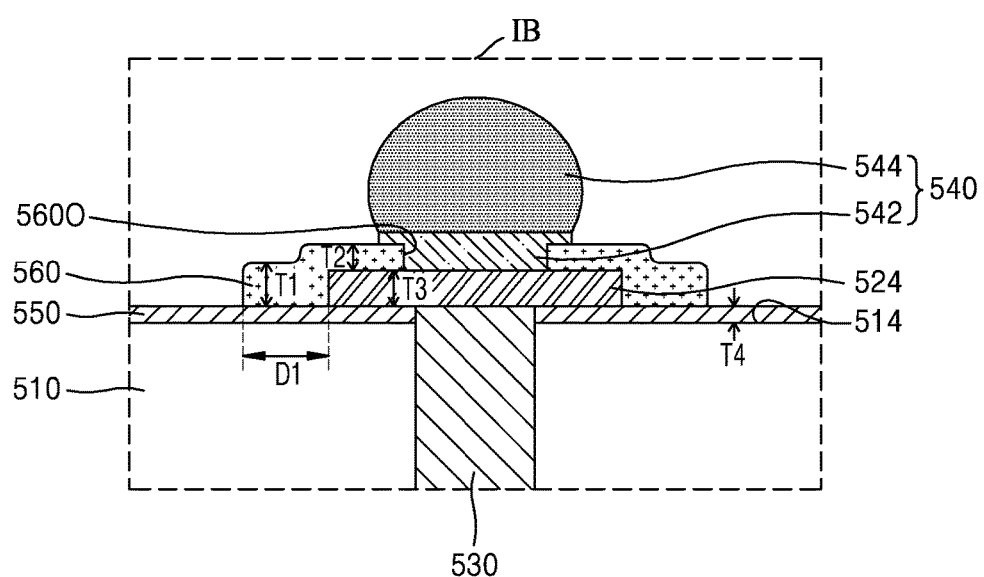
FIG. 1B is an enlarged cross-sectional view of an interposer connection terminal portion of the interposer, according to embodiments.

FIG. 1A is a cross-sectional view of an interposer according to embodiments. FIG. 1B is an enlarged cross-sectional view of an interposer connection terminal portion of the interposer, according to embodiments. In detail, FIG. 1B is an enlarged cross-sectional view of a region IB in FIG. 1A.

Referring to FIG. 1A, an interposer 500 may include a base layer 510, a redistribution structure 570 on a first surface 512 of the base layer 510, and a plurality of pad wiring layers 524 on a second surface 514 of the base layer 510. Although the first surface 512 and the second surface 514 are respectively at the bottom and the top of the base layer 510 in FIG. 1A, the first surface 512 and the second surface 514 may be respectively referred to as a top surface and a bottom surface in a semiconductor package 1 having the interposer 500 in FIG. 5A. For example, the interposer 500 of FIG. 1A is turned upside down in the semiconductor package 1 of FIG. 5A.

The base layer 510 may include a semiconductor material, glass, ceramic, or plastic. For example, the base layer 510 may include silicon. In some embodiments, the base layer 510 may be formed of a silicon semiconductor substrate. A plurality of interposer through electrodes 530 extending from the first surface 512 to the second surface 514 (e.g., through the entire base layer) may be provided in the base layer 510. Each of the interposer through electrodes 530 may include a conductive plug passing through the base layer 510 and a conductive barrier film surrounding the conductive plug. The conductive plug may have a pillar shape, and the conductive barrier film may have a cylindrical shape surrounding the side wall of the conductive plug. A plurality of via dielectric layers may be between the base layer 510 and the interposer through electrodes 530 to surround the side walls of the interposer through electrodes 530.

The redistribution structure 570 may include a redistribution dielectric layer 576 and a plurality of first redistribution pads 572 and a plurality of second redistribution pads 574, which are respectively on opposite surfaces of the redistribution dielectric layer 576. The second redistribution pads 574 may be on the first surface 512 of the base layer 510 and electrically connected to the interposer through electrodes 530. In an exemplary embodiment, the second redistribution pads 574 may contact bottom surfaces of the interposer through electrodes 530, respectively. The term "contact," as used herein, refers to a direct connection (i.e., touching) unless the context indicates otherwise. The interposer through electrodes 530 may electrically connect the second redistribution pads 574 to the pad wiring layers 524. The various pads of a semiconductor chip described herein may be conductive terminals connected to internal wiring of the semiconductor chip, and may transmit signals and/or supply voltages between an internal wiring and/or internal circuit of the semiconductor chip and an external source. The redistribution structure 570 may also include various pads serving as conductive terminals connected to internal wiring of the redistribution structure 570, and may transmit signals and/or supply voltages between the internal wiring and an internal circuit of the semiconductor chip or between the internal wiring and an external source.

The redistribution structure 570 may further include a plurality of redistribution lines 577 and redistribution vias 578, which electrically connect the first redistribution pads 572 to the second redistribution pads 574. Although the redistribution lines 577 are arranged inside the redistribution dielectric layer 576 in FIG. 1A, embodiments are not limited thereto. In some embodiments, at least some of the redistribution lines 577 may be arranged on at least one of the opposite surfaces of the redistribution dielectric layer 576. In some embodiments, at least some of the redistribution lines 577 may be connected to at least some of the first redistribution pads 572 and may extend at the same vertical level as the first redistribution pads 572. In some embodiments, at least some of the redistribution lines 577 may be connected to at least some of the second redistribution pads 574 and may extend at the same vertical level as the second redistribution pads 574. The redistribution vias 578 may penetrate at least a portion of the redistribution dielectric layer 576. The redistribution vias 578 may connect the first redistribution pads 572 to the second redistribution pads 574, the first redistribution pads 572 to the redistribution lines 577, the second redistribution pads 574 to the redistribution lines 577, or the redistribution lines 577 to each other.

In some embodiments, the first redistribution pads 572, the second redistribution pads 574, the redistribution lines 577, and the redistribution vias 578 may include copper, nickel, stainless steel, or a copper alloy such as beryllium copper. In some embodiments, the redistribution dielectric layer 576 may include at least one selected from oxide, nitride, and photo imageable dielectric (PID). In some embodiments, the redistribution dielectric layer 576 may include silicon oxide, silicon nitride, epoxy, or polyimide.

An interposer protection layer 550, the pad wiring layers 524, a plurality of interposer connection terminals 540, and a plurality of wiring protection layers 560 may be arranged on the second surface 514 of the base layer 510. The pad wiring layers 524 may be on the interposer protection layer 550 and connected to the interposer through electrodes 530, which pass through the interposer protection layer 550. The interposer connection terminals 540 may be on the pad wiring layers 524. The wiring protection layers 560 may surround the interposer connection terminals 540 and cover the pad wiring layers 524.

The wiring protection layers 560 may cover the surfaces of the pad wiring layers 524, which are not covered with the interposer connection terminals 540, on the interposer protection layer 550. In some embodiments, each of the wiring protection layers 560 may completely cover the surface, not covered with a respective interposer connection terminal 540, of a respective pad wiring layer 524. Each of the wiring protection layers 560 may have a terminal opening 560O that exposes a portion of the top surface of each of the pad wiring layers 524. Each of the interposer connection terminals 540 may be connected to a respective pad wiring layer of the pad wiring layers 524 through the terminal opening 560O. The terminal opening 560O may be filled with a lower portion of an under bump metal (UBM) layer 542. The terminal opening 560O may have a circular shape or an elliptical shape from a top down view but is not limited thereto. The wiring protection layers 560 may cover portions of a surface of the interposer protection layer 550, which are adjacent to the pad wiring layers 524, but may not cover the other portions of the surface of the interposer protection layer 550.

The interposer protection layer 550 may include an inorganic material, and the wiring protection layers 560 may include an organic material. For example, the interposer protection layer 550 may include silicon oxide, silicon nitride, or a stack structure of silicon oxide and silicon nitride, and the wiring protection layers 560 may include a polymer material. In some embodiments, the wiring protection layers 560 may be formed of PID such as polyimide.

The pad wiring layers 524 may include copper, nickel, stainless steel, or a copper alloy such as beryllium copper. Each of the interposer connection terminals 540 may include the UBM layer 542 on one of the pad wiring layers 524 and an interposer conductive cap 544 on the UBM layer 542. In some embodiments, the interposer connection terminals 540 may include a conductive material, e.g., copper (Cu), aluminum (Al), silver (Ag), tin, gold (Au), or solder, but is not limited thereto. Each of the interposer connection terminals 540 may include multiple layers or a single layer.

Referring to FIG. 1B, an interposer through electrode 530 may vertically protrude outwards from the second surface 514 of the base layer 510. For example, the interposer through electrode 530 may extend beyond the second surface 514 of the base layer 510 toward the interposer conductive cap 544. The interposer protection layer 550 may cover the second surface 514 of the base layer 510. The interposer protection layer 550 may surround a side surface of a protruding portion of the interposer through electrode 530, which protrudes from the second surface 514 of the base layer 510. In some embodiments, the interposer protection layer 550 may cover the side surface of the portion of the interposer through electrode 530 that protrudes from the second surface 514 of the base layer 510. In some embodiments, the interposer protection layer 550 may cover the side surface of the protruding portion of the interposer through electrode 530. In some embodiments, the interposer protection layer 550 may contact the side surface of the protruding portion of the interposer through electrode 530. In some embodiments, the top surface of the interposer protection layer 550 may be coplanar with the top surface of the protruding portion of the interposer through electrode 530 that protrudes from the second surface 514 of the base layer 510.

A pad wiring layer 524 may be arranged on the top surface of the interposer through electrode 530 and a portion of the top surface of the interposer protection layer 550. The bottom surface of the pad wiring layer 524 may be in contact with the top surface of the interposer through electrode 530 and the portion of the top surface of the interposer protection layer 550 adjacent to the interposer through electrode 530. In some embodiments, the bottom surface of the pad wiring layer 524 may be substantially flat. A horizontal width and a horizontal area of the pad wiring layer 524 may be respectively greater than those of the top surface of the interposer through electrode 530. In some embodiments, the pad wiring layer 524 and the interposer through electrode 530 may be concentric in a top down view.

A wiring protection layer 560 may cover the side surface and a portion of the top surface of the pad wiring layer 524. The wiring protection layer 560 may further cover a portion of the top surface of the interposer protection layer 550 adjacent to the pad wiring layer 524. In some embodiments, the wiring protection layer 560 may contact the side surface of the pad wiring layer 524, the portion of the top surface thereof, and the portion of the top surface of the interposer protection layer 550 adjacent to the pad wiring layer 524. A first thickness T1 of a portion of the wiring protection layer 560, which is away from the pad wiring layer 524 in the portion of the wiring protection layer 560 covering the portion of the top surface of the interposer protection layer 550, may be greater than a second thickness T2 of a portion of the wiring protection layer 560, which covers the portion of the top surface of the pad wiring layer 524. For example, the wiring protection layer 560 may include a first portion with the first thickness T1 that covers the top surface of the interposer protection layer 550 and a second portion with the second thickness T2 that covers the top surface of the pad wiring layer 524. In some example embodiments, the wiring protection layer 560 may include a first portion with the first thickness T1 that contacts the top surface of the interposer protection layer 550 and a second portion with the second thickness T2 that contacts the top surface of the pad wiring layer 524. The pad wiring layer 524 may have a third thickness T3, which is less than the first thickness T1 and greater than the second thickness T2. A thickness of a portion of the wiring protection layer 560, which covers a top surface of the interposer protection layer 550 and is close to the pad wiring layer 524, may be the sum of the second thickness T2 and the third thickness T3. For example, the wiring protection layer 560 may further include a third portion between the first portion and the second portion. The third portion may cover the side surface of the pad wiring layer 524 with a thickness of the sum of the second thickness T2 and the third thickness T3. In some embodiments, the third portion may contact the side surface of the pad wiring layer 524 with the thickness of the sum of the second thickness T2 and the third thickness T3. A fourth thickness T4 of the interposer protection layer 550 may be less than the third thickness T3. In some embodiments, the first thickness T1 may be greater than 5 μm, the second thickness T2 may be greater than 3 μm and less than 5 μm, and the third thickness T3 may be greater than the second thickness T2 and less than 5 μm. In some embodiments, the fourth thickness T4 may be equal to or less than 3 μm.

The wiring protection layer 560 may horizontally extend from the side surface of the pad wiring layer 524 by a first width D1. In some embodiments, the wiring protection layer 560 may cover a portion of the top surface of the interposer protection layer 550. The portion of the top surface of the interposer protection layer 550 is adjacent to the pad wiring layer 524 and has the first width D1. The first width D1 may be greater than the third thickness T3 and less than twice the third thickness T3. In some embodiments, the first width D1 may be greater than 5 μm and less than 10 μm. In some embodiments, the first width D1 may be greater than the first thickness T1.

The interposer protection layer 550 may extend between the wiring protection layer 560 and the base layer 510 and between the pad wiring layer 524 and the base layer 510 and be in contact with a side surface of the interposer through electrode 530. The bottom surface of the wiring protection layer 560 and the bottom surface of the pad wiring layer 524, i.e., surfaces of the wiring protection layer 560 and the pad wiring layer 524, which face the base layer 510, may be coplanar with each other.

An interposer connection terminal 540 may be on the pad wiring layer 524. A horizontal width and a horizontal area of the interposer connection terminal 540 may be respectively less than those of the pad wiring layer 524. The interposer connection terminal 540 may include the UBM layer 542 on the pad wiring layer 524 and the interposer conductive cap 544 on the UBM layer 542. In some embodiments, the UBM layer 542 may contact the pad wiring layer 524. In some embodiments, the interposer conductive cap 544 may include Ag, tin (Sn), Au, or solder. In some embodiments, the interposer conductive cap 544 may include SnAg.

The UBM layer 542 may extend to protrude from the top surface of the wiring protection layer 560. The UBM layer 542 may cover a portion of the top surface of the wiring protection layer 560. In some embodiments, a horizontal width and a horizontal area of an upper portion of the UBM layer 542 may be respectively greater than those of a lower portion of the UBM layer 542. The lower portion of the UBM layer 542 may fill the terminal opening 560O, and the upper portion of the UBM layer 521 may contact the top surface of the wiring protection layer 560. The wiring protection layer 560 may cover a side surface of the lower portion of the UBM layer 542 without covering a side surface of the upper portion and the top surface of the UBM layer 542. In some embodiments, the wiring protection layer 560 may surround the side surface of the lower portion of the UBM layer 542, which has relatively less horizontal width and area, without surrounding the side surface of the upper portion of the UBM layer 542, which has relatively greater horizontal width and area.

Figure 5A:
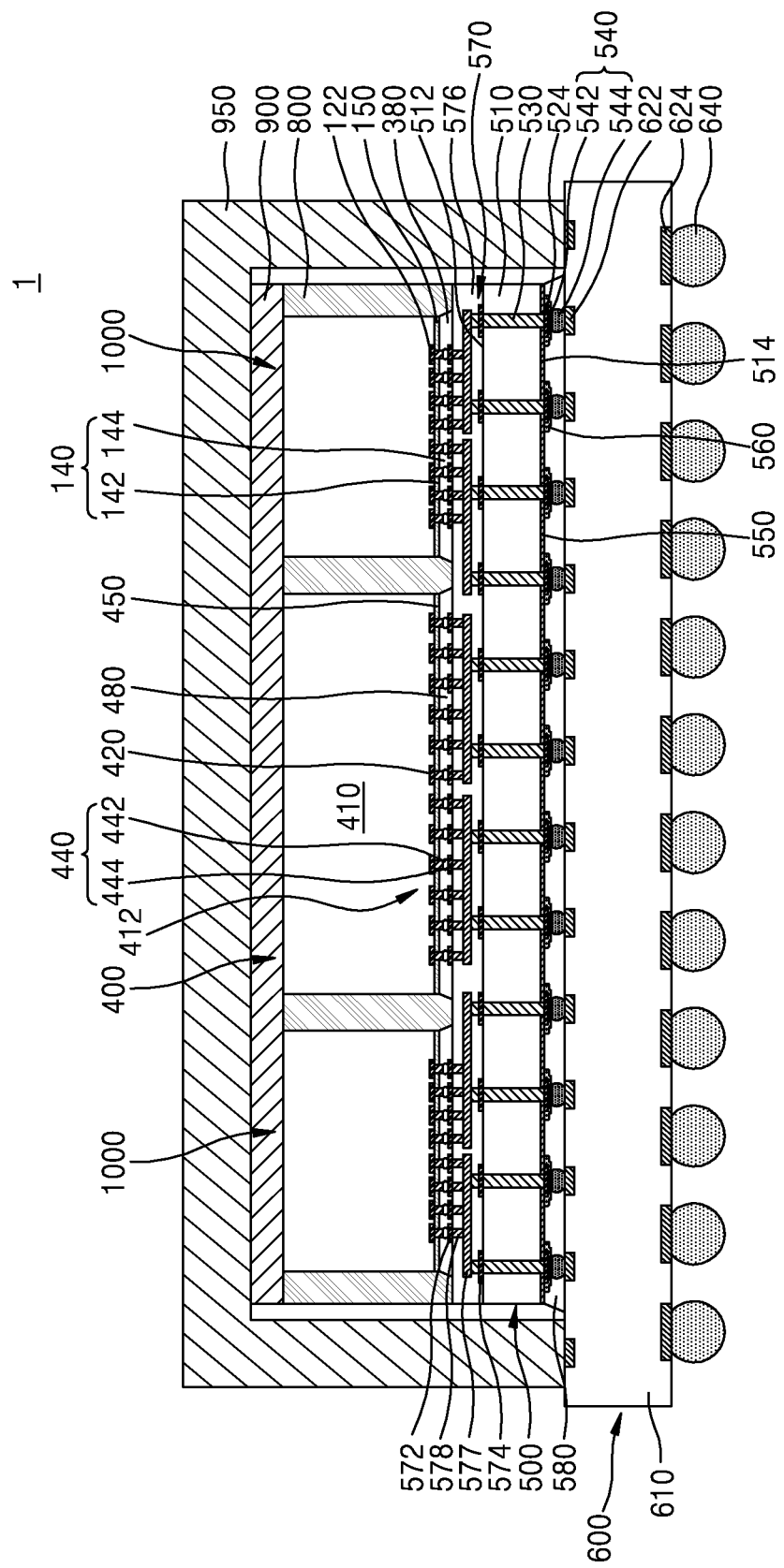
FIG. 5A is a cross-sectional view of a semiconductor package having an interposer, according to embodiments.

Referring to FIGS. 1A and 1B, because the interposer 500 includes the wiring protection layers 560 covering the pad wiring layers 524 and surrounding the interposer connection terminals 540, the wiring protection layers 560 may protect the pad wiring layers 524 and absorb stress, which may be applied to the interposer connection terminals 540 during the formation of the semiconductor package 1 of FIG. 5A having the interposer 500. In addition, due to the wiring protection layers 560, an electric short-circuit may be prevented from occurring between adjacent interposer connection terminals 540. Therefore, reliability degradation of the semiconductor package 1 may be prevented.

In addition, on the second surface 514 of the base layer 510 of the interposer 500, the wiring protection layers 560 may cover the pad wiring layers 524 and only portions of the interposer protection layer 550 adjacent to the pad wiring layers 524 and may not cover the other portions of the interposer protection layer 550. Accordingly, warpage of the interposer 500 may be prevented or reduced compared to when the wiring protection layers 560 including an organic material having a relatively large coefficient of thermal expansion (CTE) completely cover the interposer protection layer 550 on the second surface 514 of the base layer 510.

Figure 6A:
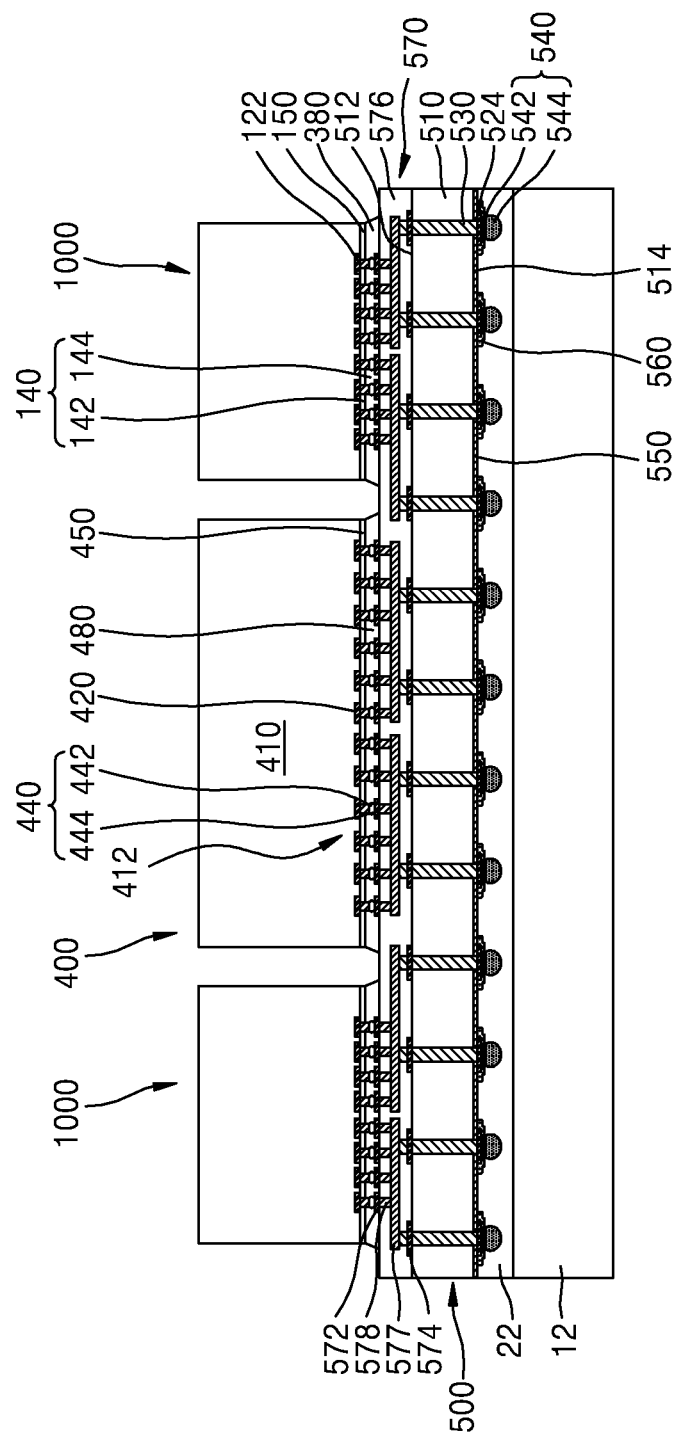
FIGS. 6A and 6B are cross-sectional views of stages in a method of manufacturing a semiconductor package having an interposer, according to embodiments.

When a second support substrate 12 in FIG. 6A is attached to the second surface 514 of the base layer 510 of the interposer 500 using a second adhesive layer 22 in FIG. 6A and then removed to form a semiconductor package having the interposer 500, a contact area between the second adhesive layer 22 and the wiring protection layers 560 is minimized so that a portion of the second adhesive layer 22 may be prevented from remaining as residue on the second surface 514 of the base layer 510 of the interposer 500.

FIGS. 2A through 2I are cross-sectional views of stages in a method of manufacturing an interposer, according to embodiments.

Figure 2A:
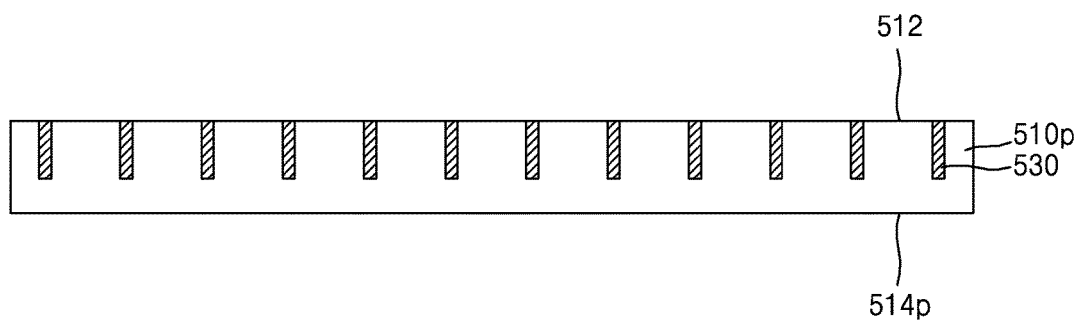
FIGS. 2A through 2I are cross-sectional views of stages in a method of manufacturing an interposer, according to embodiments.

Referring to FIG. 2A, the interposer through electrodes 530 are formed to extend from the first surface 512 of an interposer substrate 510p toward a second surface 514p thereof. In some embodiments, the interposer substrate 510p may include a silicon semiconductor substrate.

The interposer through electrodes 530 may extend from the first surface 512 of the interposer substrate 510p toward the second surface 514p such that the interposer through electrodes 530 do not completely pass through from the first surface 512 of the interposer substrate 510p to the second surface 514p thereof. For example, the interposer through electrodes 530 may be buried inside the interposer substrate 510p.

Figure 2B:
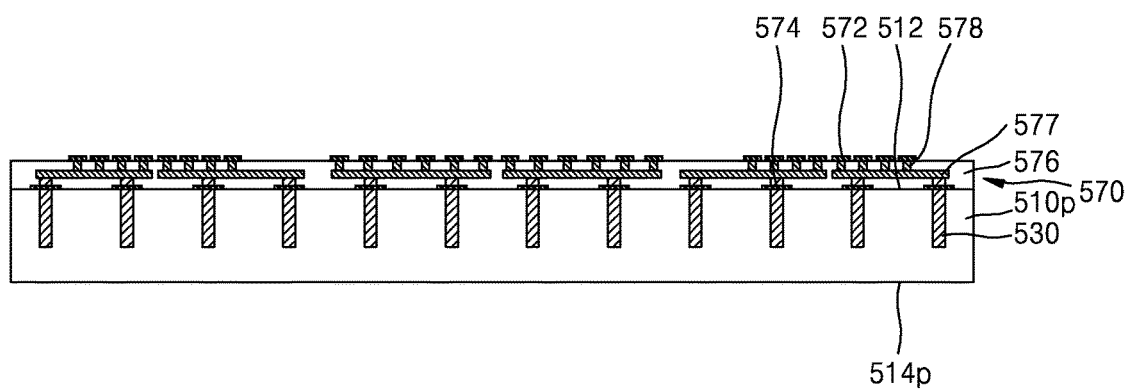

Referring to FIG. 2B, the redistribution structure 570 is formed on the first surface 512 of the interposer substrate 510p. The redistribution structure 570 includes the second redistribution pads 574 on the first surface 512 of the interposer substrate 510p, the redistribution dielectric layer 576 on the first surface 512 of the interposer substrate 510p and covering the second redistribution pads 574, and the first redistribution pads 572 on the redistribution dielectric layer 576. The second redistribution pads 574 may be connected to the interposer through electrodes 530.

The redistribution structure 570 may further include the redistribution lines 577 and the redistribution vias 578, which electrically connect the first redistribution pads 572 to the second redistribution pads 574. The redistribution lines 577 may be arranged on the top or bottom surface of the redistribution dielectric layer 576 or inside the redistribution dielectric layer 576. Each of the redistribution vias 578 may penetrate at least a portion of the redistribution dielectric layer 576.

Figure 2C:
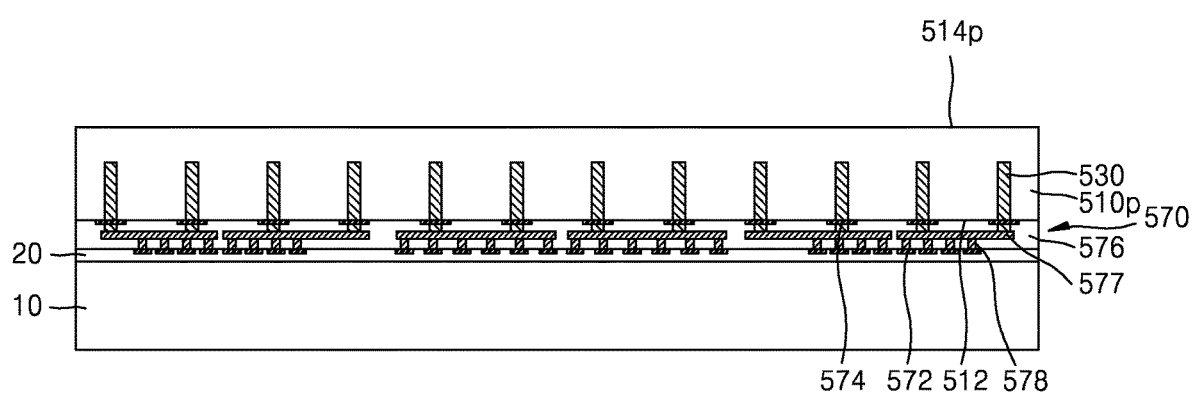

Referring to FIG. 2C, the resultant structure of FIG. 2B is turned upside down, and the interposer substrate 510p is attached to a first support substrate 10 such that the first surface 512 of the interposer substrate 510p faces the first support substrate 10. The interposer substrate 510p may be attached to the first support substrate 10 with an first adhesive layer 20 between the interposer substrate 510p and the first support substrate 10. The first support substrate 10 may include a semiconductor substrate, a glass substrate, a ceramic substrate, or a plastic substrate.

Figure 2D:
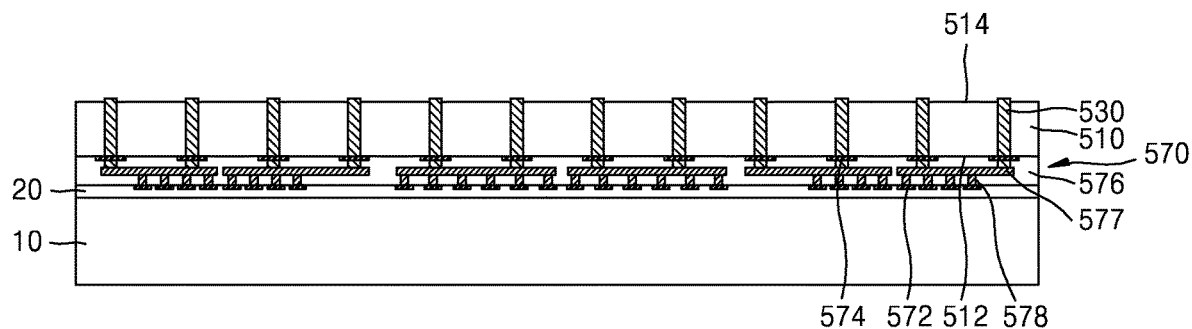

Referring to FIGS. 2C and 2D, the interposer substrate 510p is partially removed to expose the interposer through electrodes 530 such that the base layer 510 is formed. The base layer 510 may be formed by partially removing the interposer substrate 510p starting from the second surface 514p such that the interposer through electrodes 530 are exposed. The first surface 512 of the interposer substrate 510p may be the first surface 512 of the base layer 510, and a surface, which exposes the interposer through electrodes 530 and is opposite the first surface 512 of the base layer 510, may be the second surface 514 of the base layer 510.

The interposer through electrodes 530 may vertically protrude from the second surface 514 of the base layer 510. In some embodiment, the interposer through electrodes 530 may include protruding portions with a predetermined thickness. For example, the interposer substrate 510p may be partially removed by planarization such as chemical mechanical polishing such that the interposer through electrodes 530 are exposed. Thereafter, the interposer substrate 510p may be selectively removed such that the interposer through electrodes 530 vertically protrude from the base layer 510 to have the protruding portion.

Figure 2E:
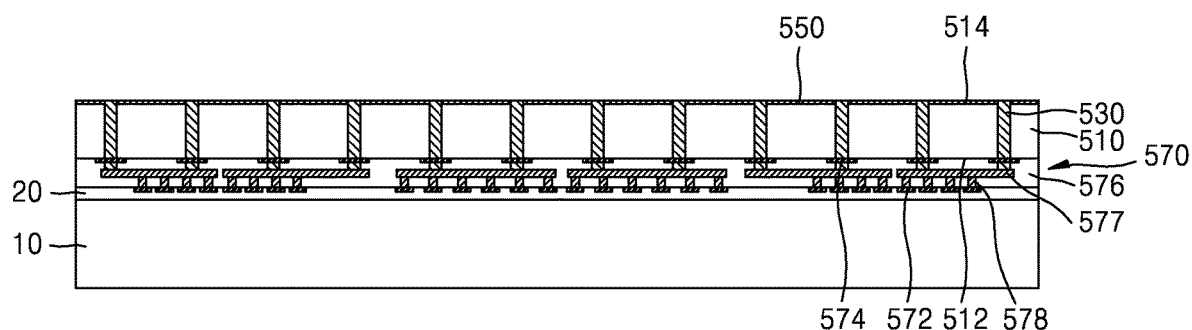

Referring to FIG. 2E, the interposer protection layer 550 is formed to cover the second surface 514 of the base layer 510 and to expose the top surfaces of the interposer through electrodes 530. In some embodiments, the interposer protection layer 550 may be formed by forming a preliminary interpose protection layer covering the second surface 514 of the base layer 510 and the interposer through electrodes 530 and by partially removing the preliminary interpose protection layer to expose the top surfaces of the interposer through electrodes 530. The top surface of the interposer protection layer 550 may be coplanar with the top surfaces of the interposer through electrodes 530 protruding from the second surface 514 of the base layer 510. In some embodiments, the top surface of the interposer protection layer 550 may be coplanar with the top surfaces of the protruding portions of the interposer through electrodes 530.

The interposer protection layer 550 may include an inorganic material. In some embodiments, the interposer protection layer 550 may include a stack of at least two different material layers. For example, the interposer protection layer 550 may include a silicon oxide layer on the second surface 514 of the base layer 510 and a silicon nitride layer on the silicon oxide layer. In some embodiments, the silicon oxide layer may be thinner than the silicon nitride layer. For example, the interposer protection layer 550 may have a thickness which is equal to or less than 3 μm.

Figure 2F:
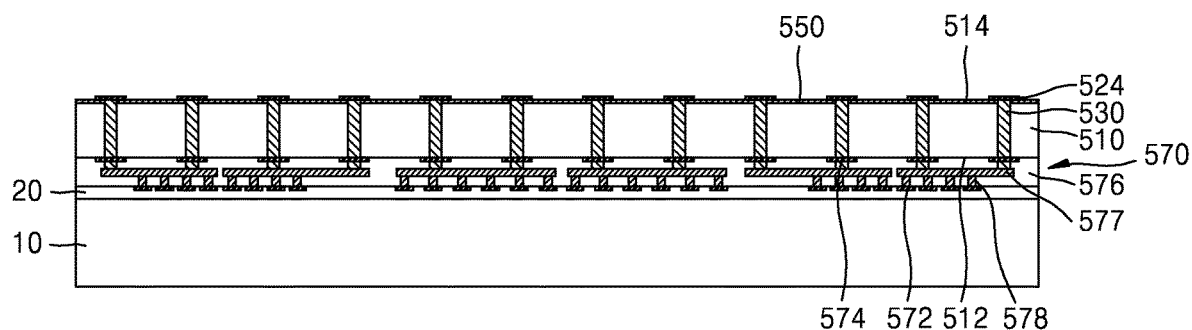

Referring to FIG. 2F, the pad wiring layers 524 are formed on the interposer through electrodes 530. The horizontal width and area of each of the pad wiring layers 524 may be greater than those of the top surface of a respective interposer through electrode of the interposer through electrodes 530 such that each pad wiring layer 524 covers the top surface of the respective interposer through electrode and a portion of the top surface of the interposer protection layer 550 adjacent thereto the interposer through electrode 530.

Figure 2G:
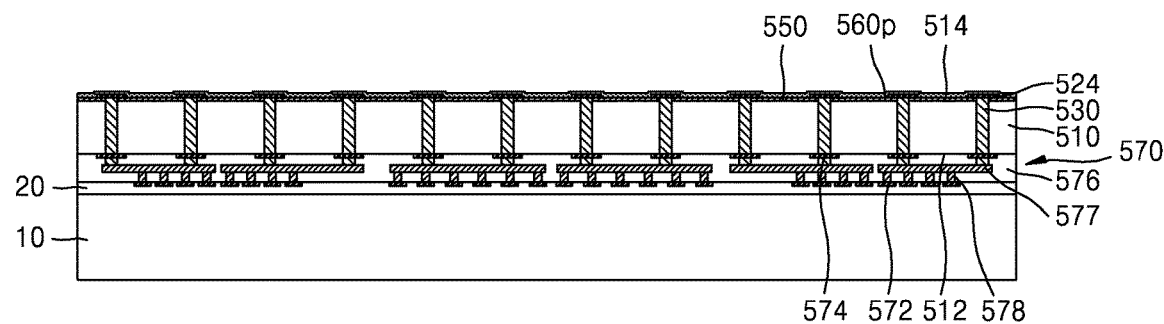

Referring to FIG. 2G, a preliminary wiring protection layer 560p is formed to cover the pad wiring layers 524 and the interposer protection layer 550. For example, the preliminary wiring protection layer 560p may be formed by coating. In some embodiments, the preliminary wiring protection layer 560p may include PID.

The preliminary wiring protection layer 560p may be formed such that the first thickness T1 (in FIG. 1B) on the top surface of the interposer protection layer 550 away from the pad wiring layers 524 is greater than the second thickness T2 (in FIG. 1B) on the top surfaces of the pad wiring layers 524. The preliminary wiring protection layer 560p may be formed such that the first thickness T1 on the top surface of the interposer protection layer 550 away from the pad wiring layers 524 is greater than the third thickness T3 (in FIG. 1B) of the pad wiring layers 524 and the second thickness T2 on the top surfaces of the pad wiring layers 524 is less than the third thickness T3 of the pad wiring layers 524.

Figure 2H:
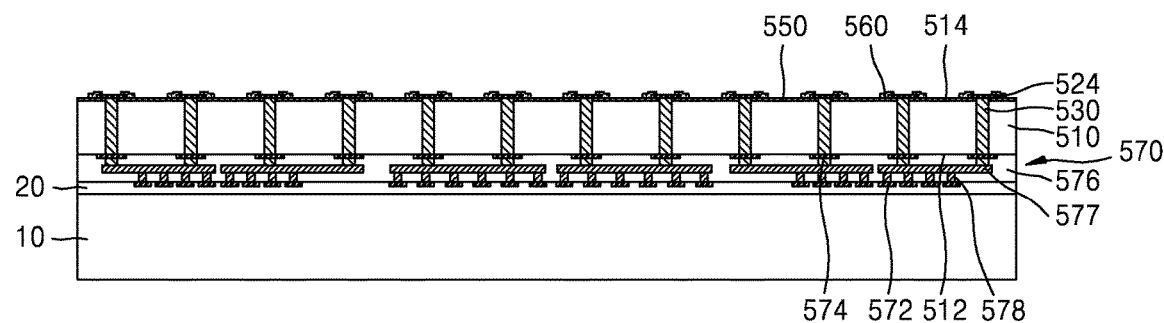

Referring to FIGS. 2G and 2H, the wiring protection layer 560 is formed by partially removing the preliminary wiring protection layer 560p, and the wiring protection layer 560 exposes portions of the top surface of the interposer protection layer 550 and a portion of the top surface of each of the pad wiring layers 524. The wiring protection layer 560 may be formed by partially removing the preliminary wiring protection layer 560p by performing exposure and development (i.e., a photolithography process) on the preliminary wiring protection layer 560p.

The wiring protection layer 560 may expose a portion of the top surface of the wiring protection layer 560, which is away from each of the pad wiring layers 524 by the first width D1 (in FIG. 1B), and a central portion of the top surface of each pad wiring layer 524, except for portions of the top surface of the pad wiring layer 524, which are near the edge of the pad wiring layer 524. In some embodiments, the wiring protection layer 560 may cover a portion of the top surface of a corresponding one of the pad wiring layers 524, which is near the edge of the pad wiring layer 524, the entire side surface of the pad wiring layer 524, and a portion of the top surface of the interposer protection layer 550, which is within the first width D1 (in FIG. 1B) from the pad wiring layer 524.

Figure 2I:
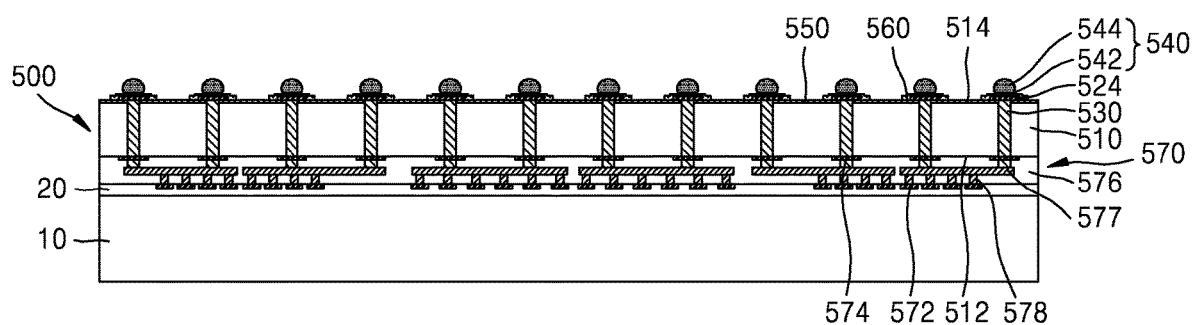

Referring to FIG. 2I, the interposer connection terminals 540 each including the UBM layer 542 and the interposer conductive cap 544, are formed. The UBM layer 542 covers a portion, i.e., the central portion, of the top surface of the pad wiring layer 524, which is exposed without being covered with the wiring protection layer 560. The interposer conductive cap 544 covers the top surface of the UBM layer 542. In some embodiments, the UBM layer 542 may be formed by plating (e.g., an electroplating process or an electroless plating process).

Thereafter, the interposer 500 may be formed by removing the first adhesive layer 20 and the first support substrate 10 from the redistribution structure 570.

Figure 3A:
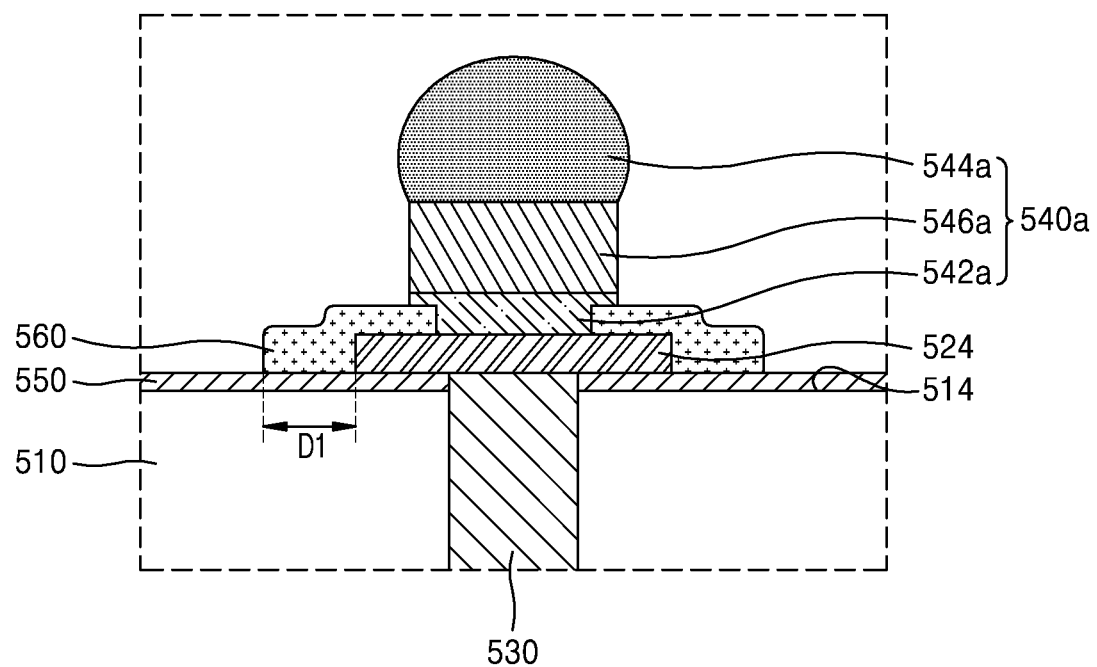
FIGS. 3A through 3C are enlarged cross-sectional views of interposer connection terminal portions of an interposer, according to embodiments.
Figure 3B:
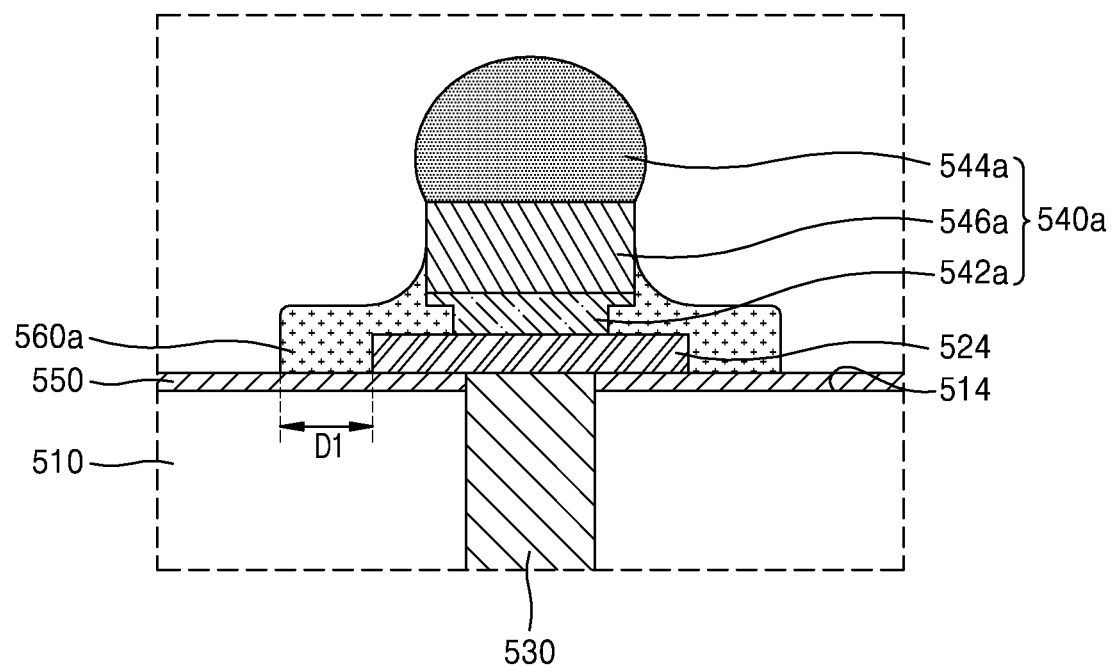
Figure 3C:
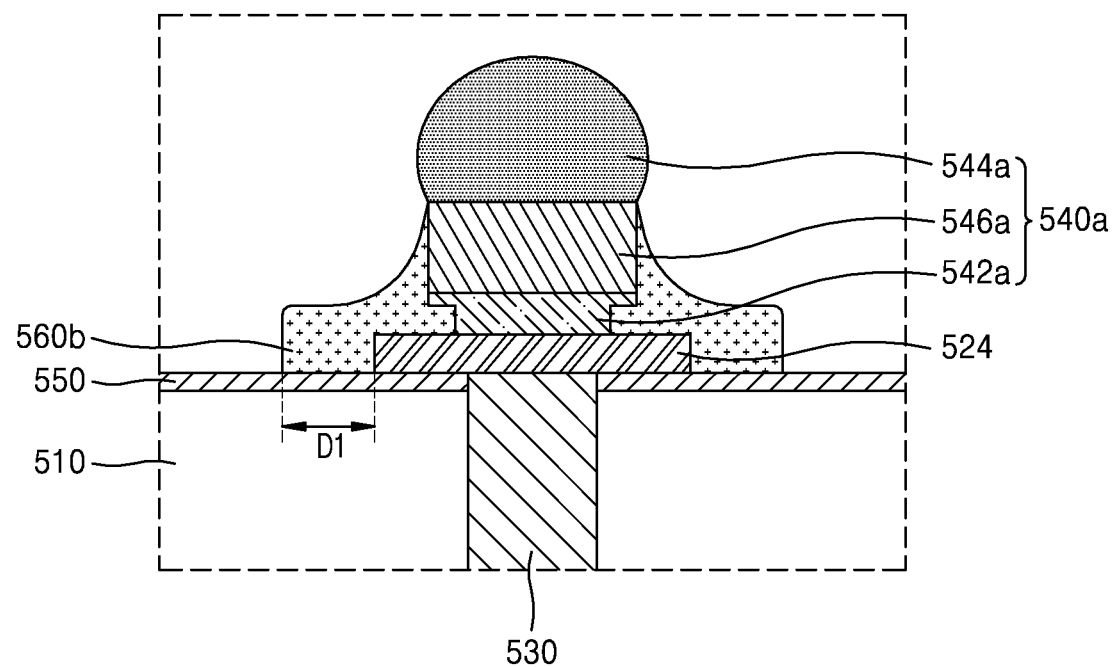

FIGS. 3A through 3C are enlarged cross-sectional views of interposer connection terminal portions of an interposer, according to embodiments. In detail, FIGS. 3A through 3C are enlarged cross-sectional views of portions corresponding to the region D3 in FIG. 1A. In FIGS. 1A and 1B and FIGS. 3A through 3C, like numerals denote like elements, and redundant descriptions may be omitted.

Referring to FIG. 3A, an interposer connection terminal 540a may be on the pad wiring layer 524. A horizontal width and area of the interposer connection terminal 540a may be respectively less than those of the pad wiring layer 524. The interposer connection terminal 540a may include a UBM layer 542a on the pad wiring layer 524, an interposer conductive pillar 546a on the UBM layer 542a, and an interposer conductive cap 544a on the interposer conductive pillar 546a.

The UBM layer 542a may extend to protrude from the top surface of the wiring protection layer 560. The UBM layer 542a may cover a portion of the top surface of the wiring protection layer 560. In some embodiments, a horizontal width and area of an upper portion of the UBM layer 542a may be respectively greater than those of a lower portion of the UBM layer 542a. In some embodiments, the UBM layer 542a may contact the pad wiring layer 524, a side surface of the wiring protection layer 560 and the top surface thereof.

The interposer conductive pillar 546a may be between the UBM layer 542a and the interposer conductive cap 544a. The interposer conductive pillar 546a may include copper, nickel, stainless steel, or a copper alloy such as beryllium copper. A horizontal width and area of the interposer conductive pillar 546a may be substantially the same as those of the upper portion of the UBM layer 542a. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," may be exactly the same, equal, or planar, or may be the same within acceptable variations that may occur, for example, due to manufacturing processes.

Referring to FIG. 3B, the interposer connection terminal 540a may include a UBM layer 542a on the pad wiring layer 524, an interposer conductive pillar 546a on the UBM layer 542a, and an interposer conductive cap 544a on the interposer conductive pillar 546a.

A wiring protection layer 560a may cover a portion of the top surface of the pad wiring layer 524 and the side surface of the pad wiring layer 524. The wiring protection layer 560a may further cover the side surface of the UBM layer 542a and a lower portion of the side surface of the interposer conductive pillar 546a. The top end (e.g., a top surface) of the wiring protection layer 560a may be at a lower vertical level than the top surface of the interposer conductive pillar 546a. In some embodiment, the top end of the wiring protection layer 560a may be connected to a side surface of the interposer conductive pillar 546a. The wiring protection layer 560a may further cover a portion of the top surface of the interposer protection layer 550, which is near the pad wiring layer 524. The wiring protection layer 560a may horizontally extend from the side surface of the pad wiring layer 524 by the first width D1. In some embodiments, the wiring protection layer 560a may contact the portion of the top surface of the pad wiring layer 524, the side surface thereof, the side surface of the UBM layer 542a and the lower portion of the side surface of the interposer conductive pillar 546a. The wiring protection layer 560a may further contact the portion of the top surface of the interposer protection layer 550, which is near the pad wiring layer 524.

Referring to FIG. 3C, the interposer connection terminal 540a may include a UBM layer 542a on the pad wiring layer 524, an interposer conductive pillar 546a on the UBM layer 542a, and an interposer conductive cap 544a on the interposer conductive pillar 546a.

A wiring protection layer 560b may cover a portion of the top surface of the pad wiring layer 524 and the side surface of the pad wiring layer 524. The wiring protection layer 560b may cover the side surface of the UBM layer 542a and the side surface of the interposer conductive pillar 546a. The top end of the wiring protection layer 560b may be substantially at the same vertical level as the top surface of the interposer conductive pillar 546a. The wiring protection layer 560b may further cover a portion of the top surface of the interposer protection layer 550, which is near the pad wiring layer 524. The wiring protection layer 560b may horizontally extend from the side surface of the pad wiring layer 524 by the first width D1.

Figure 4A:
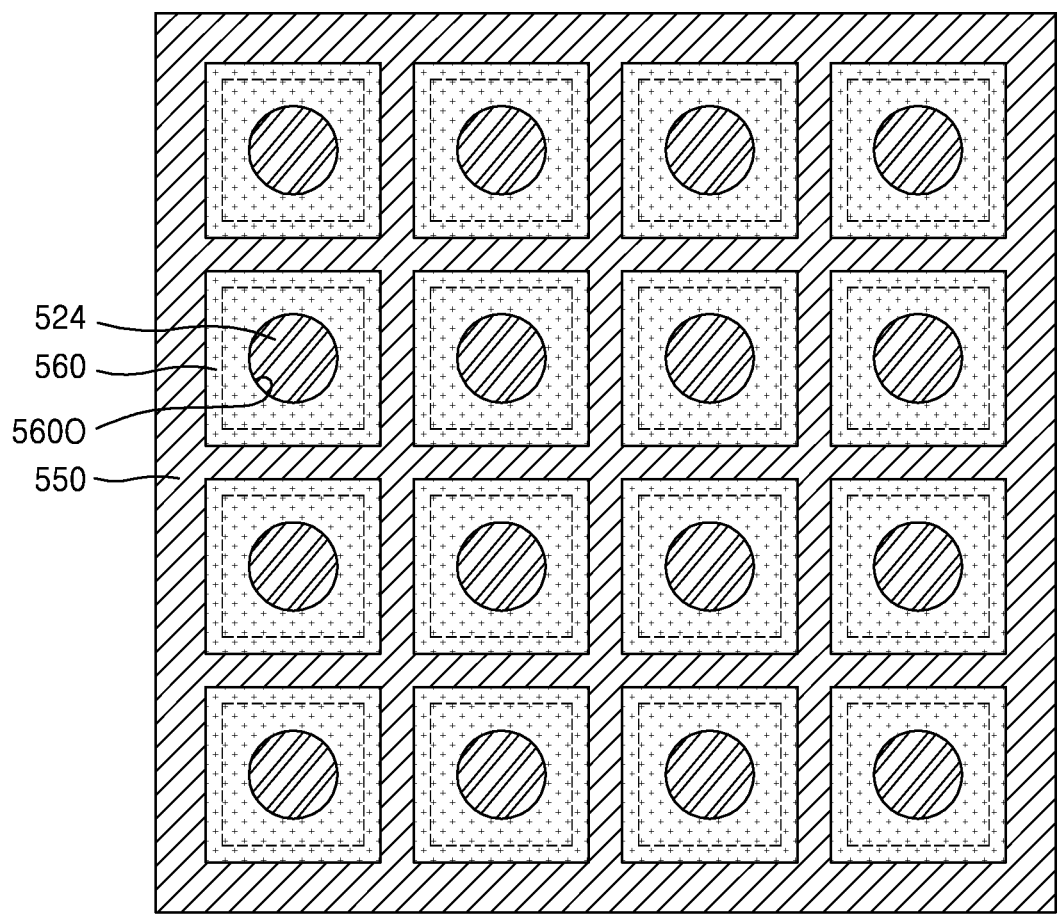
FIGS. 4A through 4C are plan views illustrating the shapes of buffer protection layers of an interposer, according to embodiments.
Figure 4B:
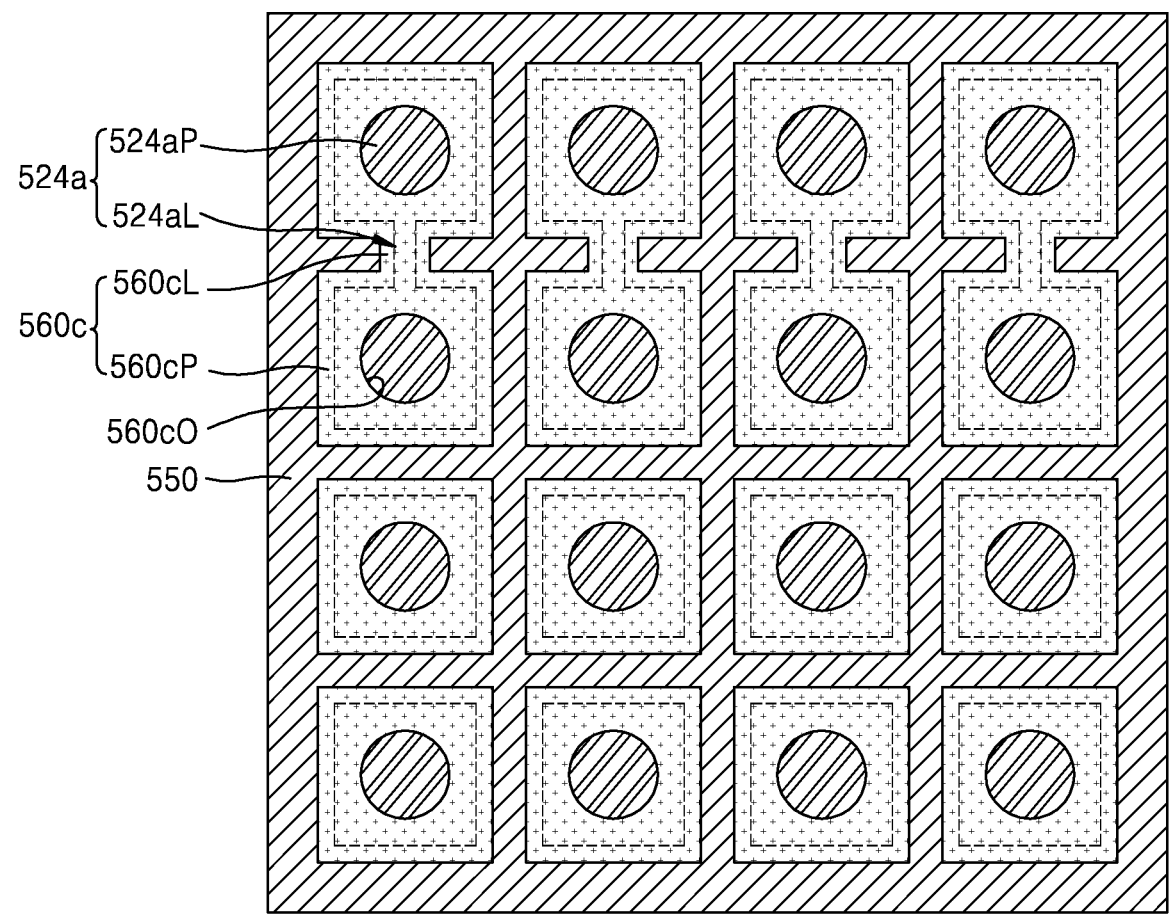
Figure 4C:
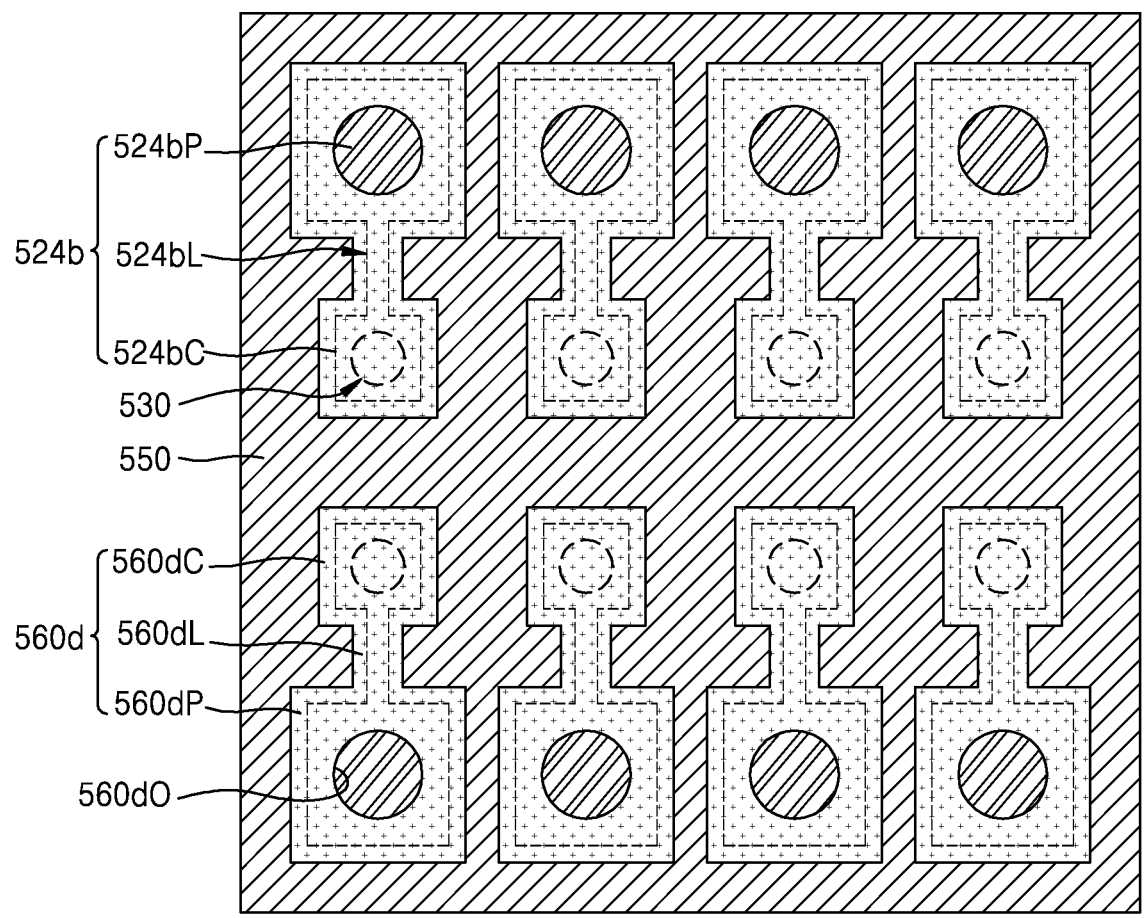

FIGS. 4A through 4C are plan views illustrating the shapes of buffer protection layers of an interposer, according to embodiments. In FIGS. 1A and 1B and FIGS. 4A through 4C, like numerals denote like elements, and redundant descriptions may be omitted.

Referring to FIG. 4A, a plurality of pad wiring layers 524 may be arranged on the interposer protection layer 550. Each of the pad wiring layers 524 may have a quadrilateral shape such as a rectangle and a square from a top down view. The pad wiring layers 524 may be separated from each other. In some embodiments, the pad wiring layers 524 may be arranged in a matrix of rows and columns.

Each of a plurality of wiring protection layers 560 may cover a portion of the top surface of a corresponding one of the pad wiring layers 524 and a portion of the top surface of the interposer protection layer 550 adjacent to the pad wiring layer 524. Each of the wiring protection layers 560 may have the terminal opening 560O exposing a portion of the top surface of the pad wiring layer 524. The terminal opening 560O may have a circular or an elliptical shape from a top down view but is not limited thereto. An interposer connection terminal 540 (FIG. 1A) may be connected to the pad wiring layer 524 through the terminal opening 560O. The terminal opening 560O may be filled with a lower portion of the UBM layer 542 in FIG. 1B, a lower portion of the UBM layer 542a in FIG. 3A, a lower portion of the UBM layer 542a in FIG. 3B, a lower portion of the UBM layer 542 in FIG. 1B, the UBM layer 542a and a lower portion of the interposer conductive pillar 546a in FIG. 3B, or the UBM layer 542a and the interposer conductive pillar 546a in FIG. 3C.

According to a top down view, an area defined by the edge of each of the wiring protection layers 560 may be greater than an area of each of the pad wiring layers 524. The edge of each of the wiring protection layers 560 may have a quadrilateral shape such as a rectangular shape and a square shape from a top down view. The wiring protection layers 560 may be separated from each other. In some embodiments, the wiring protection layers 560 may be arranged in a matrix of rows and columns.

Referring to FIG. 4B, a plurality of pad wiring layers 524a may be arranged on the interposer protection layer 550. The pad wiring layers 524a may include a plurality of pads 524aP and at least one connection line 524aL. A plurality of interposer connection terminals 540 (in FIG. 1B) or 540a (in FIGS. 3A through 3C) may be on the pads 524aP. The connection line 524aL may extend from at least one of the pads 524aP along the top surface of the interposer protection layer 550 to another pad adjacent thereto.

The pads 524aP may have a rectangular or square shape from a top down view. Some of the pads 524aP may be separated from each other. Some of the pads 524aP may be connected to each other by the connection line 524aL. One connection line 524aL and at least two pads 524aP connected to each other by the connection line 524aL may be integrally formed.

Each of a plurality of wiring protection layers 560c may cover a portion of the top surface of one of the pad wiring layers 524a and a portion of the top surface of the interposer protection layer 550 adjacent to the pad wiring layer 524a.

The wiring protection layers 560c may include a plurality of pad protection layers 560cP and at least one line protection layer 560cL. Each of the pad protection layers 560cP may cover one of the pads 524aP and a portion of the top surface of the interposer protection layer 550, which is adjacent to the pad 524aP. Each of the pad protection layers 560cP may have a terminal opening 560cO exposing a portion of the top surface of the pad 524aP. The line protection layer 560cL may cover the connection line 524aL and a portion of the top surface of the interposer protection layer 550 adjacent to the connection line 524aL. The wiring protection layers 560c may partially expose the top surfaces of the pad wiring layers 524a and may completely cover the top surface of the connection line 524aL.

In an exemplary embodiment, some of the plurality of pad wiring layers 524a may include a pad wiring layer with a first pad, a second pad and a connection line 524aL. The first pad may have the interposer connection terminal 540 arranged thereon. (See also, FIGS. 1B, 3A to 3B). The second pad may have another interposer connection terminal arranged thereon and adjacent to the interposer connection terminal. The connection line 524aL may extend from the first pad to the second pad along a top surface of the interposer protection layer 550. The wiring protection layer 524a may cover a top surface of the connection line 524aL and a side surface thereof. In an exemplary embodiment, the wiring protection layer 524a may completely cover the top surface of the connection line 524aL and the side surface thereof.

Referring to FIG. 4C, a plurality of pad wiring layers 524b may be arranged on the interposer protection layer 550. The pad wiring layers 524b may include a plurality of pads 524bP, a plurality of through electrode connectors 524bC, and a plurality of connection lines 524bL connecting the pads 524bP to the through electrode connectors 524bC. A plurality of interposer connection terminals 540 (in FIG. 1B) or 540a (in FIGS. 3A through 3C) may be on the pads 524bP. The pads 524bP may have a quadrilateral shape such as a rectangle and a square from a top down view. The through electrode connectors 524bC may be arranged on the interposer through electrodes 530 to be electrically connected thereto. The connection lines 524bL may extend from the pads 524bP to the through electrode connectors 524bC along the top surface of the interposer protection layer 550. A pad 524bP and a through electrode connector 524bC, which are connected to each other by one connection line 524bL. In some embodiments, the pad 524bP, the through electrode connector 524bC and the connection line 524bL may be integrally formed.

A plurality of wiring protection layers 560d may include a plurality of pad protection layers 560dP, a plurality of connector protection layers 560dC, and a plurality of line protection layers 560dL. Each of the pad protection layers 560dP may cover one of the pads 524bP and a portion of the top surface of the interposer protection layer 550, which is adjacent to the pad 524bP. Each of the pad protection layers 560dP may have a terminal opening 560dO exposing a portion of the top surface of the pad 524bP. Each of the connector protection layers 560dC may cover one of the through electrode connectors 524bC and a portion of the top surface of the interposer protection layer 550, which is adjacent to the through electrode connector 524bC. Each of the line protection layers 560dL may cover one of the connection lines 524bL and a portion of the top surface of the interposer protection layer 550, which is adjacent to the connection line 524bL. The wiring protection layers 560d may partially expose the top surfaces of the pad wiring layers 524b and may completely cover the top surfaces of the connection lines 524aL and the top surfaces of the through electrode connectors 524bC.

In an exemplary embodiment, the plurality of pad wiring layers 524b may include a pad wiring layer with a pad 524bP, a through electrode connector 524bC, and a connection line 524bL. The pad 524bP may have the interposer connection terminal 540 arranged thereon. The through electrode connector 524bL may have the interposer through electrode 530 arranged thereon. (See also, FIGS. 1B, 3A to 3B). The connection line 524bL may extend along a top surface of the interposer protection layer 550 and connect the pad 524bP to the through electrode connector 524bC. The interposer connection terminal 540 may vertically non-overlap the interposer through electrode 530. The wiring protection layer 524bL may cover a top surface of the connection line 5240bL and a side surface thereof, and a top surface of through electrode connector 524bC and a side surface thereof. In an exemplary embodiment, the wiring protection layer 524bL may completely cover the top surface of the connection line 5240bL and the side surface thereof, and the top surface of through electrode connector 524bC and the side surface thereof.

Figure 5B:
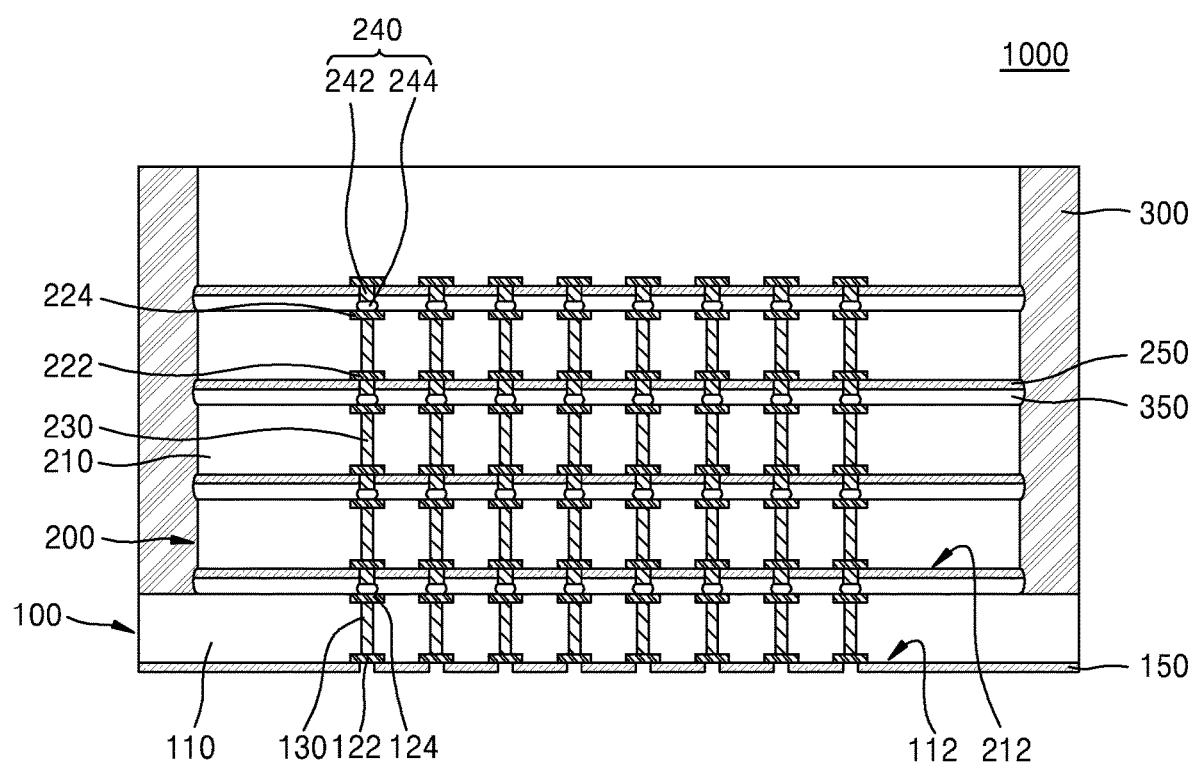
FIG. 5B is a cross-sectional view of a first semiconductor chip included in a semiconductor package having an interposer, according to embodiments.

FIG. 5A is a cross-sectional view of a semiconductor package 1 having the interposer 500, according to embodiments. FIG. 5B is a cross-sectional view of a first semiconductor chip 1000 included in the semiconductor package 1 having the interposer 500, according to embodiments.

Referring to FIGS. 5A and 5B, the semiconductor package 1 may include a package base substrate 600 having the interposer 500 mounted thereon and at least one first semiconductor chip 1000 and a second semiconductor chip 400, which are attached to the interposer 500. The first semiconductor chip 1000 and the second semiconductor chip 400 may be horizontally separated from each other on the redistribution structure 570 of the interposer 500. As used herein, a semiconductor package may include a package substrate, one or more semiconductor chips (or semiconductor dies), one or more semiconductor chips stacked on a package substrate, and an encapsulant formed on the package substrate and covering the semiconductor chips. The semiconductor package may further include a redistribution structure.

The first semiconductor chip 1000 may be electrically connected to the interposer 500 by a plurality of first connection terminals 140. The second semiconductor chip 400 may be electrically connected to the interposer 500 by a plurality of second connection terminals 440. The first semiconductor chip 1000 may include a plurality of first top connection pads 122. The second semiconductor chip 400 may include a plurality of second top connection pads 420. The interposer 500 may include a plurality of first redistribution pads 572. The first connection terminals 140 may be between the first top connection pads 122 and some of the first redistribution pads 572. The second connection terminals 440 may be between the second top connection pads 420 and some of the first redistribution pads 572.

Each of the first connection terminals 140 may include a first conductive pillar 142 on a first top connection pad 122 and a first conductive cap 144 on the first conductive pillar 142. Each of the second connection terminals 440 may include a second conductive pillar 442 on a second top connection pad 420 and a second conductive cap 444 on the second conductive pillar 442.

The first semiconductor chip 1000 includes a first sub semiconductor chip 100 and a plurality of second sub semiconductor chips 200. Although the first semiconductor chip 1000 includes four second sub semiconductor chips 200 in FIG. 5B, embodiments are not limited thereto. For example, the first semiconductor chip 1000 may include at least two second sub semiconductor chips 200. In some embodiments, the number of the plurality of second sub semiconductor chips 200 included in the first semiconductor chip 1000 may a multiple of four. In some embodiments, the number of the plurality of second sub semiconductor chips 200 may be any number greater than four. The second sub semiconductor chips 200 may be sequentially stacked on the first sub semiconductor chip 100 in a vertical direction. An active side of each of the first sub semiconductor chip 100 and the second sub semiconductor chips 200 may face downwards when the first sub semiconductor chip 100 and the second sub semiconductor chips 200 are sequentially stacked. In an exemplary embodiment, active components such as transistors and memories may be formed in proximity to the active side.

The first sub semiconductor chip 100 may include a first semiconductor substrate 110 having a first semiconductor device 112 (e.g., transistors or memories) on an active side, a first top connection pad 122 and a first bottom connection pad 124 respectively on the active side and the inactive side of the first semiconductor substrate 110, a first through electrode 130 passing through at least a portion of the first semiconductor substrate 110 and electrically connecting the first top connection pad 122 to the first bottom connection pad 124, and a first protective insulating layer 150 exposing at least a portion of the first top connection pad 122 and covering the active side of the first semiconductor substrate 110.

The first semiconductor substrate 110 may include, for example, a semiconductor material such as silicon (Si). Alternatively, the first semiconductor substrate 110 may include a semiconductor material, e.g., germanium (Ge), or a compound semiconductor such as silicon carbide (SiC), gallium arsenide (GaAs), indium arsenide (InAs), or indium phosphide (InP). The first semiconductor substrate 110 may include a conductive region, e.g., an impurity-doped well. The first semiconductor substrate 110 may have various isolation structures including a shallow trench isolation (STI) structure.

In this specification, a top surface and a bottom surface of a semiconductor substrate, e.g., the first semiconductor substrate 110, respectively refer to an active side and an inactive side of the semiconductor substrate. For example, even when the active side of the semiconductor substrate is located below the inactive side in an end product, the active side of the semiconductor substrate is referred to as the top surface and the inactive side of the semiconductor substrate is referred to as the bottom surface in this specification. The term "top" may be used for elements (e.g., transistors or memories) located on the active side of the semiconductor substrate and the term "bottom" may be used for elements located on the inactive side of the semiconductor substrate.

The first semiconductor device 112 including various kinds of individual devices may be formed on the active side of the first semiconductor substrate 110. The individual devices may include various microelectronic devices, e.g., a metal-oxide-semiconductor field effect transistor (MOSFET) such as complementary metal-oxide-semiconductor (CMOS) transistor, a system large scale integration (LSI), an image sensor such as a CMOS image sensor (CIS), a micro-electro-mechanical system (MEMS), an active element, and a passive element. The individual devices may be electrically connected to the conductive region of the first semiconductor substrate 110. The first semiconductor device 112 may further include a conductive wiring or plug, which electrically connects the individual devices or at least two individual devices to the conductive region of the first semiconductor substrate 110. Each of the individual devices may be electrically isolated from other individual devices by a dielectric film.

For example, the first sub semiconductor chip 100 may include a dynamic random access memory (DRAM) chip, a static RAM (SRAM) chip, a flash memory chip, an electrically erasable and programmable ROM (EEPROM) chip, a phase-change RAM (PRAM) chip, a magnetic RAM (MRAM) chip, or a resistive RAM (RRAM) chip. For example, the first sub semiconductor chip 100 may include a central processing unit (CPU) chip, a graphics processing unit (GPU) chip, or an application processor (AP) chip.

In some embodiments, the first semiconductor chip 1000 may be a high-bandwidth memory (HBM) DRAM including the first sub semiconductor chip 100 as a master chip and the second sub semiconductor chips 200 as slave chips. In some embodiments, the first sub semiconductor chip 100 may include a buffer chip including a serial-to-parallel conversion circuit and/or a parallel-to-serial conversion circuit. In some embodiments, the first sub semiconductor chip 100 may include a buffer chip for controlling the slave chips in the HBM DRAM. When the first sub semiconductor chip 100 includes a buffer chip for controlling an HBM DRAM semiconductor chip, the first sub semiconductor chip 100 may be called a master chip and the second sub semiconductor chips 200 may be called a slave chip.

Although the first top connection pad 122 is buried in the first semiconductor substrate 110 in FIG. 5B, embodiments are not limited thereto. In some embodiments, the first top connection pad 122 may protrude from the top surface of the first semiconductor substrate 110.

In this specification, the first semiconductor substrate 110 may include a base substrate including a semiconductor material, various conductive material layers and insulating material layers formed on the base substrate to form the first semiconductor device 112, a wiring pattern electrically connected to the first semiconductor device 112, and a wiring via. In some embodiments, the first semiconductor substrate 110 refers to what includes a semiconductor material as a main component but not to what is formed of only a semiconductor material.

Each of the second sub semiconductor chips 200 includes a second semiconductor substrate 210 having a second semiconductor device 212 (e.g., transistors or memories) on an active side, an inner top connection pad 222 and an inner bottom connection pad 224 respectively on the active side and the inactive side of the second semiconductor substrate 210, a second through electrode 230 passing through at least a portion of the second semiconductor substrate 210 and electrically connecting the inner top connection pad 222 to the inner bottom connection pad 224, and a second protective insulating layer 250 exposing at least a portion of the inner top connection pad 222 and covering the active side of the second semiconductor substrate 210. The second protective insulating layer 250 may include an inorganic material such as oxide or nitride. For example, the second protective insulating layer 250 may include at least one selected from silicon oxide and silicon nitride. In some embodiments, the second protective insulating layer 250 may include silicon nitride.

The second semiconductor substrate 210, the inner top connection pad 222, the inner bottom connection pad 224, and the second through electrode 230 are substantially the same as the first semiconductor substrate 110, the first top connection pad 122, the first bottom connection pad 124, and the first through electrode 130, respectively, and thus, detailed descriptions thereof will be omitted.

For example, the second sub semiconductor chips 200 may include a DRAM chip, an SRAM chip, a flash memory chip, an EEPROM chip, a PRAM chip, an MRAM chip, or an RRAM chip. In some embodiments, the second sub semiconductor chips 200 may include an HBM DRAM semiconductor chip. The first sub semiconductor chip 100 may be called a master chip and the second sub semiconductor chips 200 may be called slave chips.

An inner connection terminal 240 may be attached to the inner bottom connection pad 224 of each of the second sub semiconductor chips 200. The inner connection terminal 240 may be electrically connected to the first bottom connection pad 124 of the first sub semiconductor chip 100 via the inner top connection pad 222 of a second sub semiconductor chip 200, the inner bottom connection pad 224 thereof and the second through electrode 230.

The inner connection terminal 240 may include an inner conductive pillar 242 on the inner top connection pad 222 and an inner conductive cap 244 on the inner conductive pillar 242.

An insulating adhesive layer 350 may be between two adjacent chips among the first sub semiconductor chip 100 and the second sub semiconductor chips 200. The insulating adhesive layer 350 may include a non-conductive film (NCF), a non-conductive paste (NCP), an insulating polymer, or an epoxy resin. The insulating adhesive layer 350 may surround the inner connection terminal 240 and fill between the first sub semiconductor chip 100 and a second sub semiconductor chip 200 adjacent thereto or between two adjacent second sub semiconductor chips 200.

In some embodiments, among the second sub semiconductor chips 200, a second sub semiconductor chip 200 on the top farthest from the first sub semiconductor chip 100 may not include the inner bottom connection pad 224 and the second through electrode 230. In some embodiments, among the second sub semiconductor chips 200, the second sub semiconductor chip 200 on the top farthest from the first sub semiconductor chip 100 may be thicker than the other second sub semiconductor chips 200. The present invention is not limited thereto. In some embodiments, the second sub semiconductor chips 200 may have the same thickness. In some embodiments, the second sub semiconductor chips 200 may include the same kind of a semiconductor chip.

A width and area of the first sub semiconductor chip 100 may be respectively greater than those of each of the second sub semiconductor chips 200. The first semiconductor chip may further include a molding layer 300 on the first sub semiconductor chip 100 to surround the side surfaces of the second sub semiconductor chips 200 and the side surface of the insulating adhesive layer 350. For example, the molding layer 300 may include an epoxy mold compound (EMC).

Referring to FIG. 5A, the second semiconductor chip 400 may include a third semiconductor substrate 410, a second top connection pad 420, a third protective insulating layer 450, and a second connection terminal 440. The second connection terminal 440 may include the second conductive pillar 442 on the second top connection pad 420 and the second conductive cap 444 on the second conductive pillar 442. The third semiconductor substrate 410, the second top connection pad 420, the third protective insulating layer 450, and the second connection terminal 440 may be substantially similar to the first semiconductor substrate 110, the first top connection pad 122, the first protective insulating layer 150, and the first connection terminal 140, respectively, or to the second semiconductor substrate 120, the inner top connection pad 222, the second protective insulating layer 250, and the inner connection terminal 240, respectively, and thus, detailed descriptions thereof will be omitted.

For example, the second semiconductor chip 400 may include a CPU chip, a GPU chip, or an AP chip.

The interposer 500 may include the base layer 510, the redistribution structure 570 on the first surface 512 of the base layer 510, and the pad wiring layers 524 on the second surface 514 of the base layer 510. The redistribution structure 570 may include the redistribution dielectric layer 576 and the first and second redistribution pads 572 and 574, which are respectively on opposite surfaces of the redistribution dielectric layer 576. Accordingly, the first redistribution pads 572 may be on the top surface of the interposer 500 and the pad wiring layers 524 may be on the bottom surface of the interposer 500. Because the interposer 500 has been described in detail with reference to FIGS. 1A through 4C, redundant descriptions of the interposer 500 will be omitted.

A first underfill layer 380 may be between the first semiconductor chip 1000 and the interposer 500. A second underfill layer 480 may be between the second semiconductor chip 400 and the interposer 500. The first underfill layer 380 may surround the first connection terminal 140 and the second underfill layer 480 may surround the second connection terminal 440.

The semiconductor package 1 may further include a package molding layer 800 on the interposer 500 to surround the side surfaces of the first semiconductor chip 1000 and the second semiconductor chip 400. For example, the package molding layer 800 may include an EMC.

In some embodiments, the package molding layer 800 may cover the top surface of the interposer 500 and the side surface of each of the first semiconductor chip 1000 and the second semiconductor chip 400 but not the top surface of each of the first semiconductor chip 1000 and the second semiconductor chip 400. In this case, the semiconductor package 1 may further include a heat dissipation unit 950 covering the top surfaces of the first semiconductor chip 1000 and the second semiconductor chip 400. The heat dissipation unit 950 may include a heat slug or a heat sink. In some embodiments, the heat dissipation unit 950 may be on a top surface of the package base substrate 600 and surround the first semiconductor chip 1000, the second semiconductor chip 400, and the interposer 500.

The semiconductor package 1 may further include a thermal interface material (TIM) 900 between the heat dissipation unit 950 and each of the first semiconductor chip 1000 and the second semiconductor chip 400 to increase thermal coupling therebetween. The TIM 900 may include a thermal paste or a thermal film (or tape).

The interposer connection terminals 540 may be respectively attached to the pad wiring layers 524. The interposer connection terminals 540 may electrically connect the interposer 500 to the package base substrate 600. A board underfill layer 580 may be between the interposer 500 and the package base substrate 600. The board underfill layer 580 may surround the interposer connection terminals 540.

The package base substrate 600 may include a base board layer 610, a board top pad 622 on the top surface of the base board layer 610, and a board bottom pad 624 on the bottom surface of the base board layer 610. In some embodiments, the package base substrate 600 may include a printed circuit board (PCB). For example, the package base substrate 600 may include a multi-layered PCB. The base board layer 610 may include at least one material selected from phenol resin, epoxy resin, and polyimide.

A solder resist layer (not shown) may be formed on each of the top and bottom surfaces of the base board layer 610 and may expose the board top pad 622 or the board bottom pad 624. An interposer connection terminal 540 may be connected to the board top pad 622 and a package connection terminal 640 may be connected to the board bottom pad 624. The interposer connection terminal 540 may electrically connect a pad wiring layer 524 to the board top pad 622. The package connection terminal 640 connected to the board bottom pad 624 may connect the semiconductor package 1 to outside.

In some embodiments, the heat dissipation unit 950 may also perform an electromagnetic wave shielding function and may be connected to at least one board top pad that is grounded among a plurality of board top pads 622 of the package base substrate 600.

According to an embodiment, the wiring protection layers 560 of the interposer 500 cover the pad wiring layers 524 and surround the interposer connection terminals 540 in the semiconductor package 1, and accordingly, the wiring protection layers 560 may protect the pad wiring layers 524 and absorb stress that may be applied to the interposer connection terminals 540 in the semiconductor package 1. In addition, the wiring protection layers 560 may prevent electric short-circuit between adjacent interposer connection terminals 540. Therefore, reliability degradation of the semiconductor package 1 may be prevented.

In addition, on the second surface 514 of the base layer 510 of the interposer 500, the wiring protection layers 560 may cover the pad wiring layers 524 and only portions of the interposer protection layer 550 adjacent to the pad wiring layers 524 without covering the other portions of the interposer protection layer 550. Accordingly, warpage of the interposer 500 may be prevented or reduced compared to when the wiring protection layers 560 including an organic material having a relatively great CTE completely cover the interposer protection layer 550 on the second surface 514 of the base layer 510.

Figure 6B:
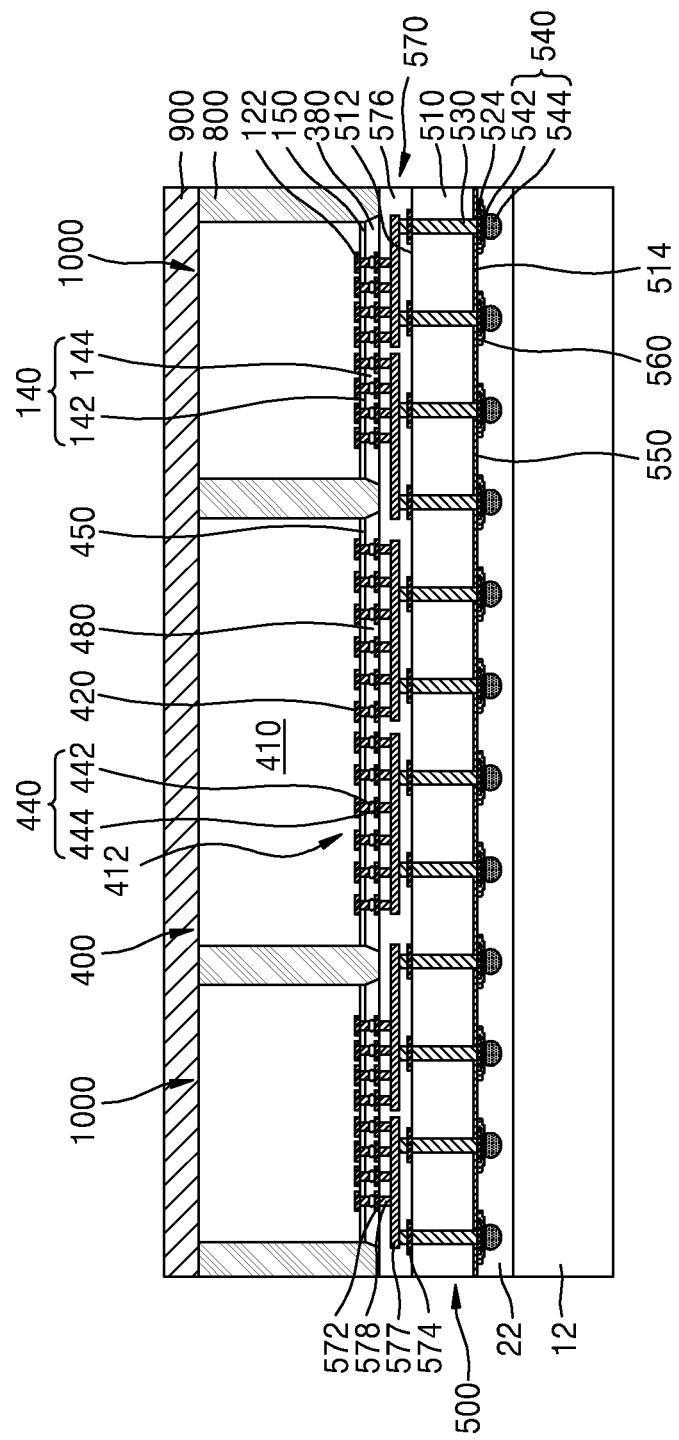

FIGS. 6A and 6B are cross-sectional views of stages in a method of manufacturing a semiconductor package having an interposer, according to embodiments.

Referring to FIG. 6A, the interposer 500 is attached to the second support substrate 12 such that a plurality of interposer connection terminals 540 of the interposer 500 face the second support substrate 12. The interposer 500 may be attached to the second support substrate 12 with the second adhesive layer 22 between the interposer 500 and the second support substrate 12. The second support substrate 12 may include a semiconductor substrate, a glass substrate, a ceramic substrate, or a plastic substrate.

Thereafter, at least one first semiconductor chip 1000 and the second semiconductor chip 400 are mounted on the interposer 500. The first semiconductor chip 1000 may be connected to the interposer 500 by the first connection terminals 140, which are between the first top connection pads 122 and some of the first redistribution pads 572. The second semiconductor chip 400 may be connected to the interposer 500 by the second connection terminals 440, which are between the second top connection pads 420 and some of the first redistribution pads 572.

The first underfill layer 380 surrounding the first connection terminal 140 may be between the first semiconductor chip 1000 and the interposer 500, and the second underfill layer 480 surrounding the second connection terminal 440 may be between the second semiconductor chip 400 and the interposer 500.

Referring to FIG. 6B, the package molding layer 800 may be formed on the interposer 500 to surround the side surfaces of the first semiconductor chip 1000 and the second semiconductor chip 400. For example, the package molding layer 800 may include an EMC.

In some embodiments, the package molding layer 800 may be formed to cover the top surface of the interposer 500 and the side surface of each of the first semiconductor chip 1000 and the second semiconductor chip 400 but not the top surface of each of the first semiconductor chip 1000 and the second semiconductor chip 400. The TIM 900 may be attached to the top surface of the first semiconductor chip 1000, the top surface of the second semiconductor chip 400, and the top surface of the package molding layer 800.

Thereafter, as shown in FIG. 5A, the second adhesive layer 22 and the second support substrate 12 are removed from the interposer 500, and the interposer 500 having the first semiconductor chip 1000 and the second semiconductor chip 400 mounted thereon is mounted on the package base substrate 600. The interposer 500 may be connected to the package base substrate 600 by the interposer connection terminals 540 between the pad wiring layers 524 and the board top pads 622.

The semiconductor package 1 may be formed by attaching the heat dissipation unit 950 to the top surface of the package base substrate 600 such that the heat dissipation unit 950 surrounds the first semiconductor chip 1000, the second semiconductor chip 400, and the interposer 500 and is in contact with the TIM 900.

On the second surface 514 of the base layer 510 of the interposer 500 in the semiconductor package 1, the wiring protection layers 560 may cover the pad wiring layers 524 and only portions of the interposer protection layer 550 adjacent to the pad wiring layers 524 without covering the other portions of the interposer protection layer 550. Accordingly, when the second adhesive layer 22 and the second support substrate 12 are attached to and then removed from the interposer 500, a contact area between the second adhesive layer 22 and the wiring protection layers 560 is minimized so that a portion of the second adhesive layer 22 may be prevented from remaining as residue on the second surface 514 of the base layer 510 of the interposer 500.

While the inventive concept has been particularly shown and described with reference to embodiments thereof, it will be understood that various changes in form and details may be made therein without departing from the spirit and scope of the following claims.

What is claimed is:
1. An interposer comprising:
a base layer having a first surface and a second surface opposite the first surface;
a redistribution structure on the first surface of the base layer;
an interposer protection layer on the second surface of the base layer;
a pad wiring layer on the interposer protection layer;
an interposer through electrode passing through the base layer and the interposer protection layer and electrically connecting the redistribution structure to the pad wiring layer;
an interposer connection terminal attached to the pad wiring layer; and
a wiring protection layer including a first portion covering a portion of the interposer protection layer adjacent to the pad wiring layer, a second portion covering a portion of a top surface of the pad wiring layer, and a third portion covering a side surface of the pad wiring layer,
wherein the third portion is disposed between the first portion and the second portion, and
wherein the first portion, the second portion and the third portion have thicknesses, in a perpendicular direction with respect to the first surface, different from each other.

2. The interposer of claim 1,
wherein the interposer through electrode includes a protruding portion vertically extending toward the interposer connection terminal beyond the second surface of the base layer.

3. The interposer of claim 2,
wherein the interposer protection layer is disposed between the base layer and the pad wiring layer and surrounds a side surface of the protruding portion.

4. The interposer of claim 2,
wherein a top surface of the interposer protection layer is coplanar with a top surface of the protruding portion.

5. The interposer of claim 1,
wherein a first thickness of the first portion is greater than a second thickness of the second portion.

6. The interposer of claim 5,
wherein a third thickness of the third portion is greater than the first thickness.

7. The interposer of claim 6,
wherein the wiring protection layer horizontally extends from the side surface of the pad wiring layer and covers the portion of the interposer protection layer by a first width, in a horizontal direction with respect to the first surface, from the side surface of the pad wiring layer, and the first width is greater than the third thickness and less than twice the third thickness.

8. The interposer of claim 1,
wherein the interposer connection terminal includes an under bump metal (UBM) layer and an interposer conductive cap on the UBM layer, and
wherein the UBM layer extends from the top surface of the pad wiring layer and protrudes above a top surface of the wiring protection layer, and
wherein the wiring protection layer further includes a fourth portion partially covering a side surface of the UBM layer.

9. The interposer of claim 8,
wherein the interposer connection terminal further includes an interposer conductive pillar between interposer conductive cap and the UBM layer, and
wherein a top surface of the pad wiring layer is at a lower vertical level than a top surface of the interposer conductive pillar.

10. The interposer of claim 8,
wherein the interposer connection terminal further includes an interposer conductive pillar between the interposer conductive cap and the UBM layer, and
wherein the pad wiring layer covers a side surface of the interposer conductive pillar.

11. The interposer of claim 1,
wherein the pad wiring layer includes a first pad, a second pad and a connection line, the first pad having the interposer connection terminal arranged thereon, the second pad having another interposer connection terminal arranged thereon, and the connection line extending from the first pad to the second pad along a top surface of the interposer protection layer, and
wherein the wiring protection layer completely covers a top surface of the connection line and a side surface thereof.

12. The interposer of claim 1,
wherein the pad wiring layer includes a pad, a through electrode connector, and a connection line, the pad having the interposer connection terminal arranged thereon, the through electrode connector having the interposer through electrode arranged thereon, and the connection line extending along a top surface of the interposer protection layer and connecting the pad to the through electrode connector,
wherein the interposer connection terminal does not vertically overlap the interposer through electrode, and
wherein the wiring protection layer completely covers a top surface of the connection line and a side surface thereof, and a top surface of through electrode connector and a side surface thereof.

13. A semiconductor package comprising:
an interposer including:
a base layer having a first surface and a second surface opposite the first surface,
a redistribution structure on the first surface of the base layer,
an interposer protection layer on the second surface of the base layer,
a plurality of pad wiring layers on the interposer protection layer,
a plurality of interposer through electrodes passing through the base layer and the interposer protection layer, and electrically connecting the redistribution structure to the plurality of pad wiring layers,
a plurality of interposer connection terminals attached to the plurality of pad wiring layers, and
a plurality of wiring protection layers on the interposer protection layer,
wherein the plurality of interposer through electrodes are grouped into a plurality of interposer through electrode groups,
wherein each of the plurality of wiring protection layers includes a first portion covering a respective portion of the interposer protection layer adjacent to a respective pad wiring layer, a second portion covering a portion of a top surface of a respective pad wiring layer, a third portion covering a side surface of the respective pad wiring layer, and a fourth portion covering a lower portion of a respective interposer connection terminal,
wherein the third portion is disposed between the first portion and the second portion, and
wherein the second portion is disposed between the third portion and the fourth portion;
a first semiconductor chip and a second semiconductor chip that are horizontally separated from each other on the redistribution structure and electrically connected to a first group among the plurality of interposer through electrode groups and a second group among the plurality of interposer through electrode groups, respectively, through the redistribution structure; and
a package base substrate having the interposer mounted thereon and connected to the plurality of interposer connection terminals.

14. The semiconductor package of claim 13,
wherein the redistribution structure includes:
a redistribution dielectric layer;
a plurality of first redistribution pads on a surface of the redistribution dielectric layer,
wherein the surface of the redistribution dielectric layer is spaced apart from the second surface of the base layer and the plurality of first redistribution pads are grouped into a plurality of first redistribution pad groups; and
a plurality of second redistribution pads on the first surface of the base layer,
wherein the plurality of second redistribution pads are connected to the plurality of interposer through electrodes, and electrically connected to the plurality of first redistribution pads,
wherein the first semiconductor chip is connected to a first group among the plurality of first redistribution pad groups by a plurality of first connection terminals, and
wherein the second semiconductor chip is connected to a second group among the plurality of first redistribution pad groups by a plurality of second connection terminals.

15. The semiconductor package of claim 13,
wherein the interposer protection layer is disposed between the base layer and each of the plurality of pad wiring layers and surrounds a side surface of a protruding portion of each of the plurality of interposer through electrodes, the protruding portion vertically extending away from the second surface of the base layer, and
wherein a top surface of the interposer protection layer is coplanar with a top surface of the protruding portion.

16. The semiconductor package of claim 13,
wherein a first thickness of the first portion is greater than a second thickness of the second portion,
wherein a third thickness of the third portion is greater than the first thickness of the first portion,
wherein the first thickness of the first portion is greater than a third thickness of each of the plurality of pad wiring layers, and wherein the first thickness, the second thickness and the third thickness are measured in a perpendicular direction with respect to the first surface.

17. The semiconductor package of claim 16,
wherein each of the plurality of wiring protection layers horizontally extends from the side surface of the respective pad wiring layer and covers the respective portion of the interposer protection layer by a first width, in a horizontal direction with respect to the first surface, from the side surface of the respective pad wiring layer, the first width being greater than the third thickness.

18. An interposer comprising:
a base layer having a first surface and a second surface opposite the first surface;
an interposer through electrode passing through the base layer and including a protruding portion vertically extending away from the second surface of the base layer;
an interposer protection layer on the second surface of the base layer, wherein the interposer protection layer has a top surface coplanar with a top surface of the protruding portion and surrounds a side surface of the protruding portion;
a pad wiring layer on the interposer protection layer and connected to the protruding portion,
wherein the interposer protection layer is disposed between the base layer and the pad wiring layer;
an interposer connection terminal attached to the pad wiring layer; and
a wiring protection layer including a first portion covering a portion of the interposer protection layer adjacent to the pad wiring layer, a second portion covering a portion of a top surface of the pad wiring layer and a third portion covering a side surface of the pad wiring layer,
wherein the third portion is disposed between the first portion and the second portion, and
wherein the first portion, the second portion and the third portion have thicknesses, in a perpendicular direction with respect to the first surface, different from each other.

19. The interposer of claim 18,
wherein the wiring protection layer horizontally extends from the side surface of the pad wiring layer and covers the portion of the interposer protection layer by a first width from the side surface of the pad wiring layer,
wherein a first thickness of the first portion is greater than a second thickness of the second portion, and
wherein a third thickness of the third portion is greater than the first thickness of the first portion.

20. The interposer of claim 18,
wherein the wiring protection layer includes an organic material, and
wherein the interposer protection layer includes an inorganic material.

* * * * *